US012564000B2

(12) United States Patent
Park et al.

(10) Patent No.: US 12,564,000 B2
(45) Date of Patent: Feb. 24, 2026

(54) APPARATUS AND METHOD FOR TREATING A SUBSTRATE

(71) Applicant: SEMES CO., LTD., Cheonan-si (KR)

(72) Inventors: Kun Hee Park, Gwangju (KR); Young Joon Han, Cheonan-si (KR); Cheol Hwan Jeong, Pyeongtaek-si (KR); Dae Hun Kim, Pyeongtaek-si (KR); Seong Hyun Yun, Seongnam-si (KR); Ye Jin Choi, Seoul (KR); Eun Hyeok Choi, Cheonan-si (KR); Tae Ho Kang, Suwon-si (KR); Young Jin Kim, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 463 days.

(21) Appl. No.: 18/145,538

(22) Filed: Dec. 22, 2022

(65) Prior Publication Data

US 2023/0207355 A1 Jun. 29, 2023

(30) Foreign Application Priority Data

Dec. 24, 2021 (KR) ........................ 10-2021-0186890
Apr. 8, 2022 (KR) ........................ 10-2022-0043812

(51) Int. Cl.
*H01L 21/67* (2006.01)
*B08B 1/12* (2024.01)
(Continued)

(52) U.S. Cl.
CPC .......... *H01L 21/67207* (2013.01); *B08B 1/12* (2024.01); *B08B 1/20* (2024.01);
(Continued)

(58) Field of Classification Search
CPC ......... H01L 21/67207; H01L 21/67046; H01L 21/67051; H01L 21/67178;
(Continued)

(56) References Cited

U.S. PATENT DOCUMENTS

| | | | |
|---|---|---|---|
| 10,236,196 B2 | 3/2019 | Saito et al. | |
| 11,069,546 B2 * | 7/2021 | Amano | ............. H01L 21/67184 |
| 2013/0078061 A1 * | 3/2013 | Enokida | ............ H01L 21/67766 |
| | | | 414/226.05 |

FOREIGN PATENT DOCUMENTS

| | | |
|---|---|---|
| CN | 106057706 A | 10/2016 |
| KR | 100917304 B1 | 9/2009 |

(Continued)

OTHER PUBLICATIONS

English Machine Translation of KR-10-2019-0023007-A (Seo) (Year: 2025).*

*Primary Examiner* — Parviz Hassanzadeh
(74) *Attorney, Agent, or Firm* — Harness, Dickey & Pierce, P.L.C.

(57) ABSTRACT

An apparatus for treating a substrate of the present invention includes a buffer unit, an inversion unit, a first transfer chamber, a second transfer chamber, a first cleaning chamber, and a second cleaning chamber. The first transfer chamber, the inversion unit, and the second transfer chamber are sequentially arranged in one direction. The first cleaning chamber is disposed at one side of the first transfer chamber, and the second cleaning chamber is disposed at one side of the second transfer chamber. A first main transfer robot provided in the first transfer chamber directly transfers the substrate between the buffer unit, the inversion unit, and the first cleaning chamber. The second main transfer robot provided in the second transfer chamber directly transfers the substrate between the buffer unit, the inversion unit, and the second cleaning chamber.

16 Claims, 16 Drawing Sheets

(51) Int. Cl.

| | |
|---|---|
| *B08B 1/20* | (2024.01) |
| *B08B 3/02* | (2006.01) |
| *B08B 13/00* | (2006.01) |
| *B25J 11/00* | (2006.01) |
| *B25J 15/00* | (2006.01) |
| *H01L 21/687* | (2006.01) |

(52) U.S. Cl.
CPC .............. *B08B 3/022* (2013.01); *B08B 13/00* (2013.01); *B25J 11/0085* (2013.01); *B25J 15/0052* (2013.01); *H01L 21/67046* (2013.01); *H01L 21/67051* (2013.01); *H01L 21/67178* (2013.01); *H01L 21/67196* (2013.01); *H01L 21/68707* (2013.01); *H01L 21/68764* (2013.01)

(58) Field of Classification Search
CPC ......... H01L 21/67196; H01L 21/68707; H01L 21/68764; B08B 1/20; B08B 1/12; B08B 3/022; B08B 13/00; B25J 11/0085; B25J 15/0052
USPC .......................................................... 18/729
See application file for complete search history.

(56) References Cited

FOREIGN PATENT DOCUMENTS

| | | | |
|---|---|---|---|
| KR | 101181162 | B1 | 9/2012 |
| KR | 10-2016-0120661 | A | 10/2016 |
| KR | 10-2019-0023007 | A | 3/2019 |
| KR | 102220919 | B1 | 2/2021 |
| KR | 102309933 | B1 | 10/2021 |
| WO | WO-2013187090 | A1 | 12/2013 |

* cited by examiner

FIG. 19

APPARATUS AND METHOD FOR TREATING A SUBSTRATE

CROSS-REFERENCE TO RELATED APPLICATIONS

This application claims priority to and the benefit of Korean Patent Application Nos. 10-2021-0186890 and 10-2022-0043812 filed in the Korean Intellectual Property Office on Dec. 24, 2021, and Apr. 8, 2022, the entire contents of which are incorporated herein by reference.

TECHNICAL FIELD

The present invention relates to an apparatus and a method for treating a substrate, and more particularly, to an apparatus for treating a substrate with a substrate inversion unit and a method therefor.

BACKGROUND ART

A semiconductor process includes a process of cleaning a thin film, foreign materials, and particles on a substrate. The process includes an upper surface cleaning process for cleaning an upper surface of the substrate on which a pattern is formed, and a back surface cleaning process for cleaning a back surface of the substrate on which the pattern is not formed. In general, a surface cleaning process is performed by supplying a cleaning liquid to the upper surface of the substrate in a state in which the upper surface of the substrate is placed to face upwardly. In addition, a back surface cleaning process is performed by scrubbing the back surface of the substrate with a brush while supplying the liquid to the back surface of the substrate while the back surface of the substrate is placed to face upwardly. In order to perform both the upper and back cleaning processes as described above, an apparatus for treating a substrate treating is provided with an inversion unit that inverts the positions of the upper and back surfaces of the substrate.

In general, buffer units and inversion units are stacked on each other between an index block and a treatment block, and transfer robots are arranged on both sides of the buffer unit and inversion unit, respectively. A transfer unit transfers the substrate between the buffer unit and the inversion unit. In addition, the treatment block has a main transfer path along which a main transfer robot runs, and on both sides of the main conveyance path, upper cleaning chambers performing an upper cleaning process and back cleaning chambers performing a back cleaning process are arranged along the main transfer path. The main transfer robot transfers the substrate between the buffer unit, the inversion unit, a plurality of upper surface cleaning chambers, and a plurality of back surface cleaning chambers.

However, in the apparatus for treating a substrate having the above-mentioned structure, since one main transfer robot is responsible for all transfers of the substrate between the buffer unit, the inversion unit, the plurality of upper surface cleaning chambers, and the plurality of back surface cleaning chambers, a lot of loads are taken in the main transfer robot. For this reason, the substrates cannot be quickly transferred to a next unit or chamber, and may wait for a long time in the unit or chamber.

SUMMARY OF THE INVENTION

The present invention has been made in an effort to provide an apparatus for treating a substrate with a structure in which a transfer efficiency of the substrate can be improved.

The present invention has also been made in an effort to provide an apparatus for treating a substrate with a structure capable of reducing the waiting time of the substrate in a unit or a chamber provided in the apparatus for treating a substrate.

The object of the present invention is not limited thereto, and other objects not mentioned will be clearly understood by those of ordinary skill in the art from the following description.

An exemplary embodiment of the present invention provides an apparatus for treating a substrate, including an index module and a treatment block disposed adjacent to the index block. The index module includes one or a plurality of load ports on which the substrate is accommodated, and an index frame provided with an index robot that transfers the substrate between a container placed in the load port and the treatment block. The treatment block includes a buffer unit in which the substrate temporarily stays, an inversion unit configured to invert the substrate so that positions of a pattern surface and a non-pattern surface of the substrate are changed, treating chambers configured to treat the substrate, and transfer chambers provided with a main transfer robot that transfers the substrate between the buffer unit, the inversion unit, and the treating chamber. The buffer unit and the inversion unit are disposed to be stacked in the vertical direction, and when viewed from the top, the index frame and the buffer unit are arranged in a first direction. The transfer chambers include a first transfer chamber disposed on one side of the buffer unit and a second transfer chamber disposed on the other side of the buffer unit, and when viewed from the top, the first transfer chamber, the buffer unit, and the second transfer chamber are arranged in a second direction perpendicular to the first direction. the treating chambers include a first cleaning chamber arranged on one side of the first transfer chamber and a second cleaning chamber arranged on the other side of the second transfer chamber, when viewed from the top, the first transfer chamber and the first cleaning chamber are arranged in a direction parallel to the first direction, and when viewed from the top, the second transfer chamber and the second cleaning chamber are arranged in a direction parallel to the first direction. The main transfer robot provided in the first transfer chamber is provided to directly transfer the substrate between the buffer unit, the inversion unit, and the first cleaning chamber. The main transfer robot provided in the second transfer chamber is provided to directly transfer the substrate between the buffer unit, the inversion unit, and the second cleaning chamber.

According to the exemplary embodiment, the first cleaning chamber and the second cleaning chamber may be arranged in a direction parallel to the second direction.

According to the exemplary embodiment, the first cleaning chamber may include a support unit configured to supports and rotates the substrate, a brush unit configured to clean the substrate supported by the support unit, and a liquid supply unit configured to supply a treatment liquid to the substrate supported by the support unit.

According to the exemplary embodiment, the first cleaning chamber may be provided in a plural form, and the plurality of first cleaning chambers may be disposed to be stacked on each other.

According to the exemplary embodiment, the first cleaning chamber and the second cleaning chamber may be provided in the same structure.

According to the exemplary embodiment, the apparatus for treating a substrate further includes a controller configured to control the treatment block, and the controller may control the treating chamber such that the pattern surface of the substrate is cleaned by supplying a treatment liquid to the pattern surface of the substrate with the liquid supply unit when the substrate is placed on the support unit with the pattern surface of the substrate facing upwardly, and control the treating chamber such that the non-pattern surface of the substrate is cleaned with the brush unit when the substrate is placed on the support unit with the non-pattern surface of the substrate facing upwardly.

According to the exemplary embodiment, the buffer unit includes a main buffer and a sub buffer disposed to be stacked with the main buffer, and the main transfer robot is capable of transferring a substrate to the main buffer and the sub buffer, respectively.

According to the exemplary embodiment, the sub buffer may be disposed between the main buffer and the inversion unit.

According to the exemplary embodiment, a plurality of inversion units may be provided, the inversion units may be stacked on each other, and the plurality of inversion units may be disposed adjacent to each other.

According to the exemplary embodiment, the main transfer robot includes a base plate and a hand mounted on the base plate, and the hand may be provided to be movable forward and backward with respect to the base plate, and the base plate is capable of a movement in a third direction and a rotational movement among a movement parallel to the first direction, a movement parallel to the second direction, a movement in the third direction perpendicular to the first direction and the second direction, respectively, and the rotational movement around the third direction as an axis.

According to the exemplary embodiment, a plurality of hands may be provided to the main transfer robot, and the plurality of hands may be provided to be movable forward and backward independently of each other.

Another exemplary embodiment of the present invention provides an apparatus for treating a substrate, including an index block and a first process block and a second process block disposed adjacent to the index block. The index block includes one or a plurality of load ports on which the substrate is accommodated, and an index frame provided with an index robot that transfers the substrate between a container placed in the load port and the first process block, and between the container placed in the load port and the second process block. The first process block and the second process block are stacked in the vertical direction. Each of the first process block and the second process block includes a buffer unit in which the substrate temporarily stays, an inversion unit configured to invert the substrate so that positions of a pattern surface and a non-pattern surface of the substrate are changed, treating chambers configured to treat the substrate, and transfer chambers provided with a main transfer robot that transfers the substrate between the buffer unit, the inversion unit, and the treating chamber. The buffer unit and the inversion unit are disposed to be stacked in the vertical direction, and when viewed from the top, the index frame and the buffer unit are arranged in a first direction. The transfer chambers include a first transfer chamber disposed on one side of the buffer unit and a second transfer chamber disposed on the other side of the buffer unit, and when viewed from the top, the first transfer chamber, the buffer unit, and the second transfer chamber are arranged in a second direction perpendicular to the first direction. The treating chambers include a first cleaning chamber arranged on one side of the first transfer chamber, and a second cleaning chamber arranged on the other side of the second transfer chamber, when viewed from the top, the first transfer chamber and the first cleaning chamber are arranged in a direction parallel to the first direction, when viewed from the top, the second transfer chamber and the second cleaning chamber are arranged in a direction parallel to the first direction, and the first cleaning chamber and the second cleaning chamber are arranged in a direction parallel to the second direction. The main transfer robot provided in the first transfer chamber is provided to directly transfer the substrate between the buffer unit, the inversion unit, and the first cleaning chamber, and the main transfer robot provided in the second transfer chamber is provided to directly transfer the substrate between the buffer unit, the inversion unit, and the second cleaning chamber.

According to the exemplary embodiment, the first cleaning chamber and the second cleaning chamber provided in the first process block, and the first cleaning chamber and the second cleaning chamber provided in the second process block each include a support unit configured to support and rotate the substrate, a brush unit configured to clean the substrate supported by the support unit, and a liquid supply unit configured to supply a treatment liquid to the substrate supported by the support unit.

According to the exemplary embodiment, the apparatus for treating a substrate further includes a controller configured to controlling the first process block and the second process block. The controller controls the treating chamber such that the pattern surface of the substrate is cleaned by supplying a treatment liquid to the pattern surface of the substrate with the liquid supply unit when the substrate is placed on the support unit with the pattern surface of the substrate facing upwardly, and control the treating chamber such that the non-pattern surface of the substrate is cleaned with the brush unit when the substrate is placed on the support unit with the non-pattern surface of the substrate facing upwardly.

According to the exemplary embodiment, the buffer unit includes a main buffer and a sub buffer disposed to be stacked with the main buffer, and the main transfer robot may be provided to transfer the substrate to the main buffer and the sub buffer, respectively, the first process block may be disposed on the second process block. In the first process block, the main buffer may be disposed below the inversion unit, and the sub buffer is disposed between the main buffer and the inversion unit, and in the second process block, the main buffer may be disposed above the inversion unit, and the sub buffer is disposed between the main buffer and the inversion unit.

According to the exemplary embodiment, the main transfer robot includes a base plate and a plurality of hands mounted on the base plate, and the plurality of hands are provided to be movable forward and backward independently of each other, and the base plate is capable of a movement in a third direction and a rotational movement among a movement parallel to the first direction, a movement parallel to the second direction, a movement in the third direction perpendicular to the first direction and the second direction, respectively, and the rotational movement around the third direction.

In addition, the present invention provides a method for treating a substrate using the apparatus for treating a substrate as described above. The method for treating a substrate includes taking out the substrate from the container placed in the load port and transferring the substrate to the buffer unit with the index robot, transferring the substrate to the first cleaning chamber or the second cleaning chamber with the main transfer robot provided in the first transfer chamber or the main transfer robot provided in the second transfer chamber, in the first cleaning chamber or the second cleaning chamber, treating a first process on one of a pattern surface and a non-pattern surface of the substrate, transferring the substrate on which the first process is completed, from one of the first cleaning chamber and the second cleaning chamber to the inversion unit with the main transfer robot provided in the first transfer chamber or the main transfer robot provided in the second transfer chamber, inverting positions of the pattern surface and the non-pattern surface of the substrate in the inversion unit, transferring the substrate from the inversion unit from the first cleaning chamber or the second cleaning chamber with the main transfer robot provided in the first transfer chamber or the main transfer robot provided in the second transfer chamber, treating a second process on the other of the pattern surface or the non-pattern surface of the substrate in the first cleaning chamber or the second cleaning chamber, transferring the substrate on which the second process is completed, to the buffer unit with the main transfer robot provided in the first transfer chamber or the main transfer robot provided in the second transfer chamber, and taking the substrate on which the second process is completed, from the buffer unit into the container placed in the load port with the index robot.

According to the exemplary embodiment, when the substrate is taken out of the container placed in the load port with the index robot and transferred to the buffer unit, the substrate may be disposed with the pattern surface thereof facing upwardly, before performing the treatment of the first process, the substrate taken into the buffer unit may be transferred to the inversion unit with the main transfer robot provided in the first transfer chamber or the main transfer robot provided in the second transfer chamber, in the inversion unit, the positions of the pattern surface and the non-pattern surface of the substrate may be inverted, and the treatment of the first process may treat the non-pattern surface of the substrate with the non-pattern surface thereof facing upwardly.

According to the exemplary embodiment, the treatment of the first process may treat the non-patterned surface of the substrate using a brush, and the treatment of the second process may treat the substrate by supplying a treatment liquid to the pattern surface of the substrate with the pattern surface thereof facing upwardly.

According to the exemplary embodiment, the first cleaning chamber and the second cleaning chamber may be provided in the same structure, and each of the first cleaning chamber and the second cleaning chamber is capable of treating of both the pattern surface and the non-pattern surface of the substrate.

According to the exemplary embodiment of the invention, it is possible to improve transfer efficiency of a substrate in an apparatus for treating a substrate.

Further, according to the exemplary embodiment of the present invention, it is possible to reduce the waiting time in units or chambers in the apparatus for treating a substrate.

Furthermore, according to the exemplary embodiment of the present invention, it is possible to reduce an occupation area occupied by the apparatus for treating a substrate.

The effect of the present invention is not limited to the foregoing effects, and the not-mentioned effects will be clearly understood by those skilled in the art from the present specification and the accompanying drawings.

BRIEF DESCRIPTION OF THE DRAWINGS

FIG. 19 is a view sequentially illustrating a path through which the substrate is transferred in the apparatus for treating a substrate of FIG. 1.

DETAILED DESCRIPTION

Figure 1:
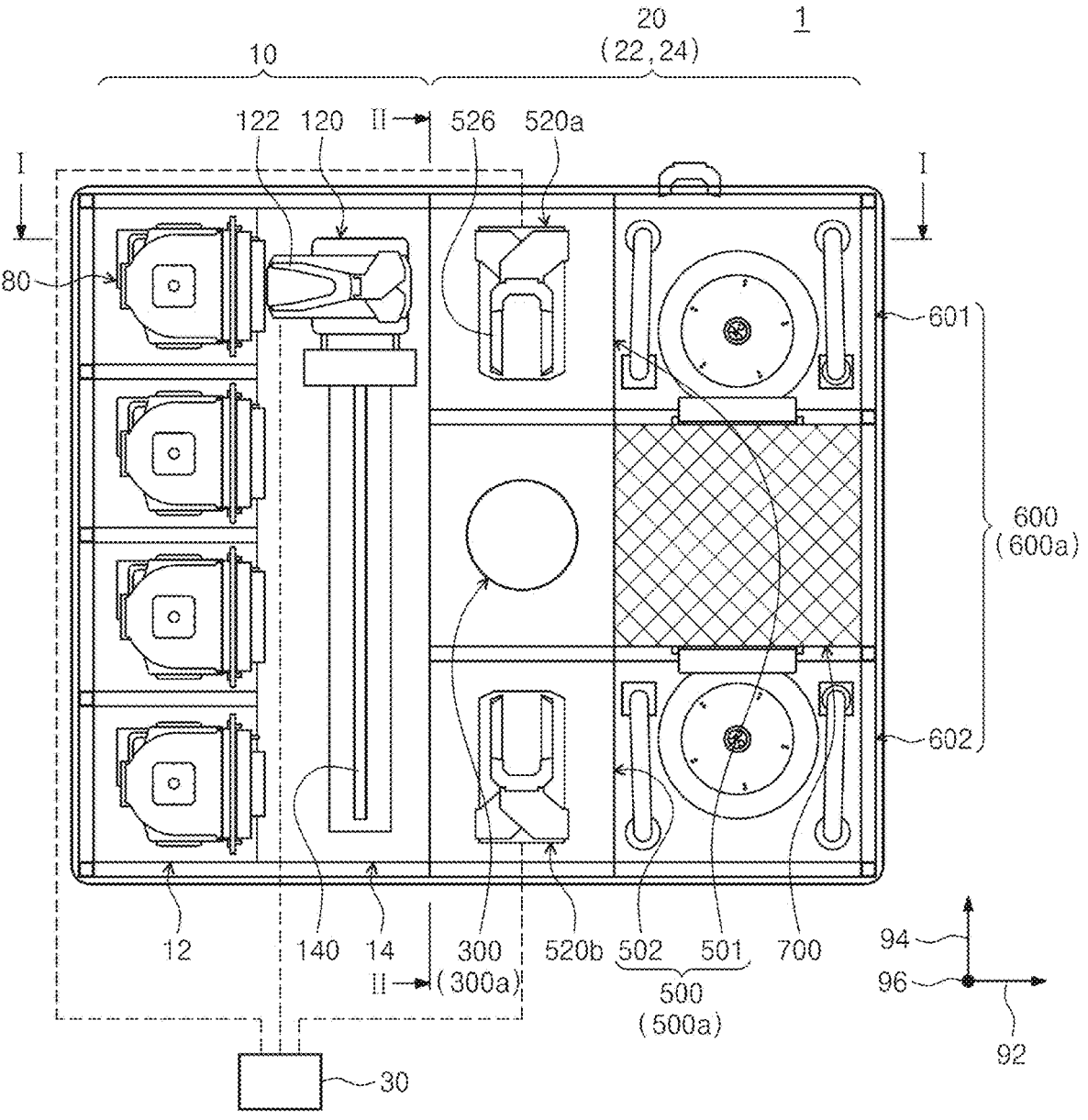
FIG. 1 is a top plan view schematically illustrating an apparatus for treating a substrate according to according to an exemplary embodiment of the present invention.

Hereinafter, exemplary embodiments of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

Figure 2:
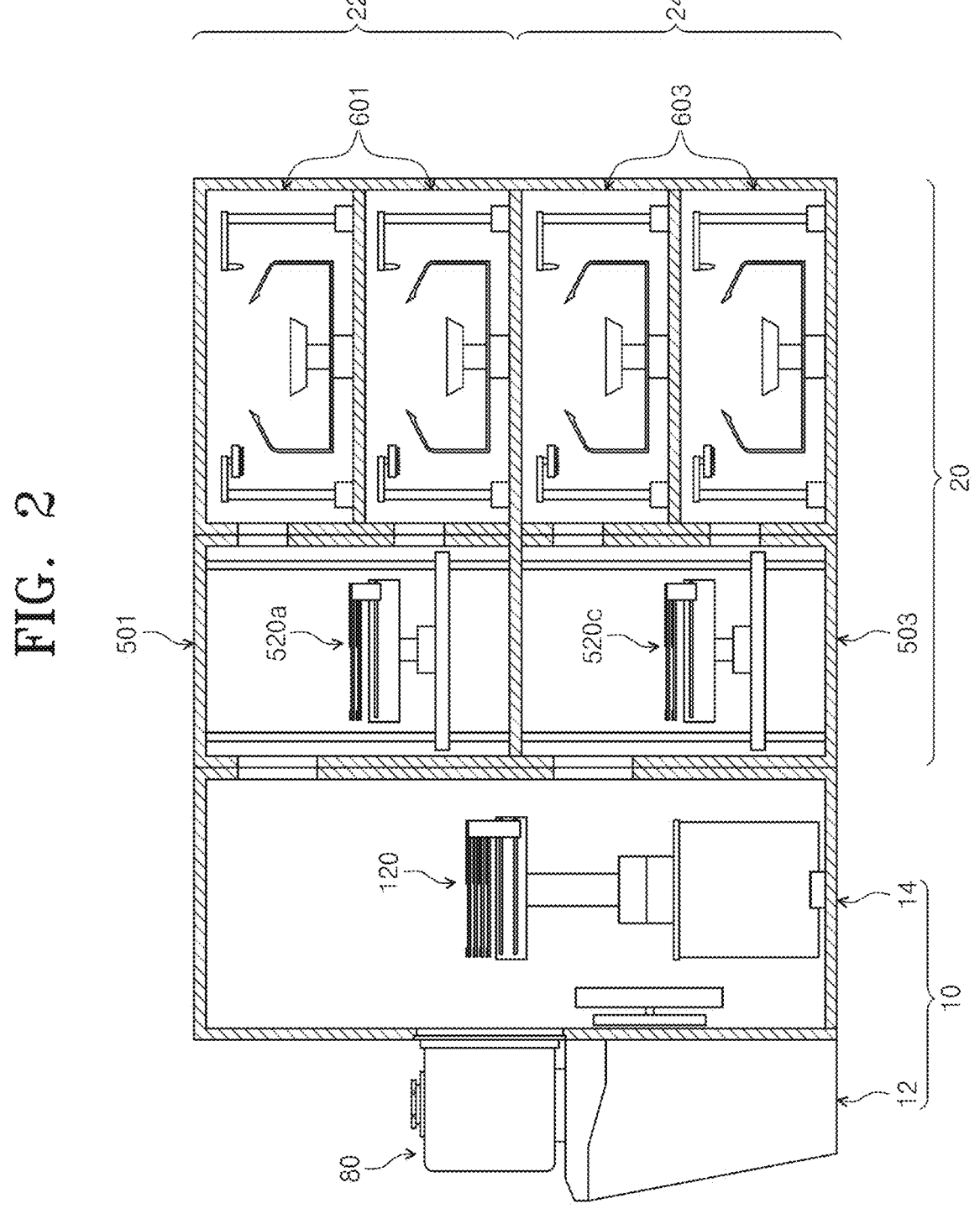
FIG. 2 is a view taken along line I-I of FIG. 1.
Figure 3:
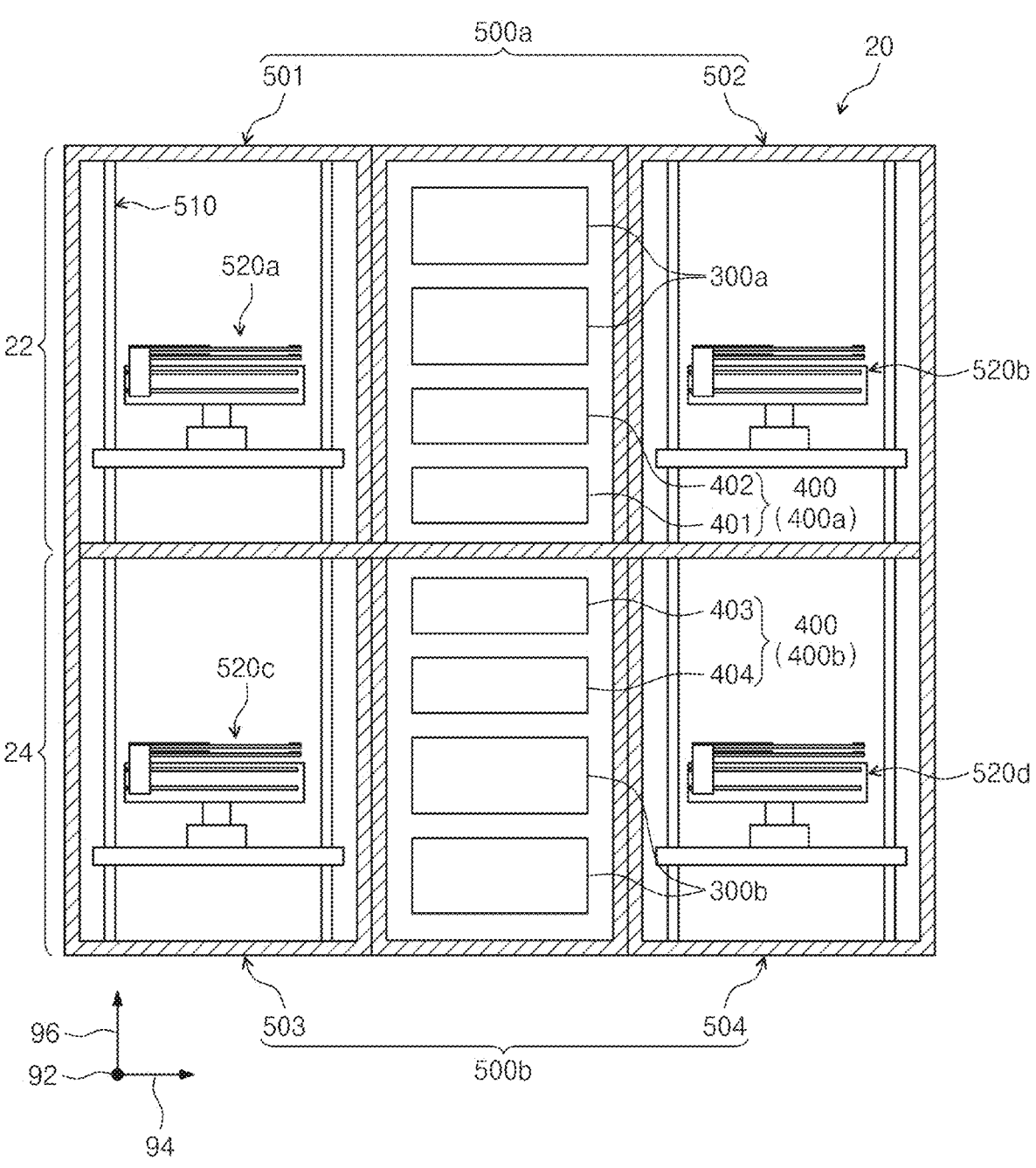
FIG. 3 is a view taken along line II-II of FIG. 1.

FIG. 1 is a top plan view schematically illustrating an apparatus for treating a substrate according to according to an exemplary embodiment of the present invention. FIG. 2 is a view taken along line I-I of FIG. 1. FIG. 3 is a view taken along line II-II of FIG. 1.

Referring to FIGS. 1 to 3, the apparatus for treating a substrate 1 includes an index block 10, a treatment block 20, and a controller 30. According to the exemplary embodiment, the index block 10 and the treatment block 20 are disposed in one direction. Hereinafter, the direction in which the index block 10 and the treatment block 20 are arranged refers to a first direction 92, and the direction perpendicular to the first direction 92 when viewed from the top refers to a second direction 94, and the direction perpendicular to both the first direction 92 and the second direction 94 refers to a third direction 96.

The index block 10 transfers a substrate W from a container 80 in which the substrate W is accommodated to the treatment block 20, and accommodates the substrate W that has been treated in the treatment block 20, in the container 80. The longitudinal direction of the index block 10 is provided as the second direction 94. The index block 10 has a load port 12 and an index frame 14. The load port 12 is disposed opposite to the treatment block 20 based on the index frame 14. The container 80 in which the substrates W are accommodated is placed in the load port 12. A plurality of load ports 12 may be provided, and the plurality of load ports 12 may be disposed in the second direction 94.

As the container 80, a sealing container 80 such as a front open unified pod (FOUP) may be used. The container 80 may be placed in the load port 12 by a transfer means (not illustrated), such as an overhead transfer, an overhead conveyor, or an automatic guided vehicle, or an operator. The substrate W has two surfaces. One of the two surfaces is provided as a pattern surface on which a pattern is formed, and the other surface is provided as a non-pattern surface on which the pattern is not formed. The substrate W may be accommodated in the container 80 while the pattern surface faces upwardly.

An index robot 120 is provided in the index frame 14. Within the index frame 14, a guide rail 140 of which the longitudinal direction is provided as the second direction may be provided, and the index robot 120 may be provided to be movable on the guide rail 140.

Figure 4:
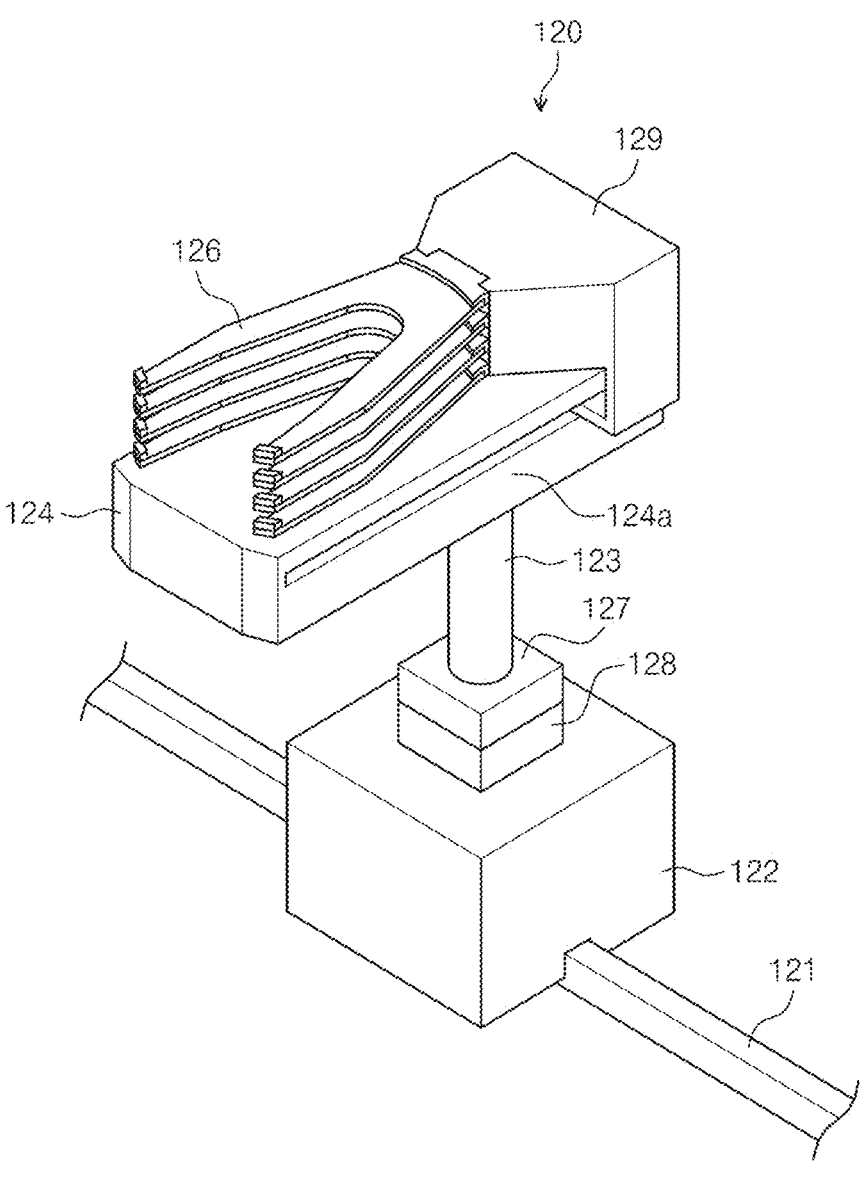
FIG. 4 is a perspective view schematically illustrating an example of an index robot.

FIG. 4 is a perspective view schematically illustrating an example of an index robot. Referring to FIG. 4, the index robot 120 includes a driving block 122, a base plate 124, and a hand 126. The driving block 122 is installed on the guide rail 121 and moves linearly in a direction parallel to the second direction 94 along the guide rail 121. The base plate 124 is coupled to the driving block 122 by a support shaft 123. The support shaft 123 is mounted on the driving block 122 to be rotatable based on a central axis thereof by the rotation driver 128. For example, the rotation driver 128 may be a motor. In addition, the support shaft 123 is moved in the longitudinal direction of the support shaft 123 by a vertical driver 127. For example, the vertical driver 127 may be a cylinder or a motor.

The hand 126 supports the substrate W. A plurality of hands 126 are provided. The hand 126 is installed on the base plate 124 so as to move linearly forward and backward. The plurality of hands 126 are provided. For example, four hands 126 may be provided. The hands 126 are provided to be spaced apart from each other in the vertical direction. According to the exemplary embodiment, a guide hole 124a may be formed on a side of the base plate 124, and the bracket 129 may be provided to be coupled to the base plate 124 through the guide hole 124a. Alternatively, the hands 126 may be provided to move forward and backward independently of each other.

The treatment block 20 has a first process block 22 and a second process block 24. The first process block 22 and the second process block 24 are disposed to be stacked with each other. The first process block 22 may be disposed on the second process block 24.

The first process block 22 has a buffer unit 400, an inversion unit 300, transfer chambers 500, and treating chambers 600. The buffer unit 400 is disposed adjacent to the index frame 14. The index frame 14 and the buffer unit 400 are arranged in the first direction 92. The index frame 14 and the inversion unit 300 are arranged in the first direction 92. The inversion unit 300 is disposed to be stacked with the buffer unit 400 in the third direction 96. For example, the inversion unit 300 is disposed above the buffer unit 400.

According to the exemplary embodiment, two transfer chambers 500 are provided. Hereinafter, the two transfer chambers 500 refer to a first transfer chamber 501 and a second transfer chamber 502. Based on the inversion unit 300, the first transfer chamber 501 is disposed on one side of the inversion unit 300, and the second transfer chamber 502 is disposed on the other side of the inversion unit 300. When viewed from the top, the first transfer chamber 501, the inversion unit 300, and the second transfer chamber 502 are sequentially arranged in the direction parallel to the second direction 94.

A guide rail 510 and a main transfer robot 520 each are disposed in the first transfer chamber 501 and the second transfer chamber 502. The guide rail 510 is provided in a direction in which the longitudinal direction thereof is parallel to the third direction 96. The main transfer robot 520 is installed on the guide rail 510 and is provided to be movable along the guide rail 510. The guide rail 510 guides a vertical movement of the main transfer robot 520. Hereinafter, the main transfer robot 520 disposed in the first transfer chamber 501 refers to a first main transfer robot 520a, and the main transfer robot 520 disposed in the second transfer chamber 502 refers to a second main transfer robot 520b. The first main transfer robot 520a and the second main transfer robot 520b may be provided in the same structure. Hereinafter, a structure of the first main transfer robot 520a will be mainly described.

Figure 5:
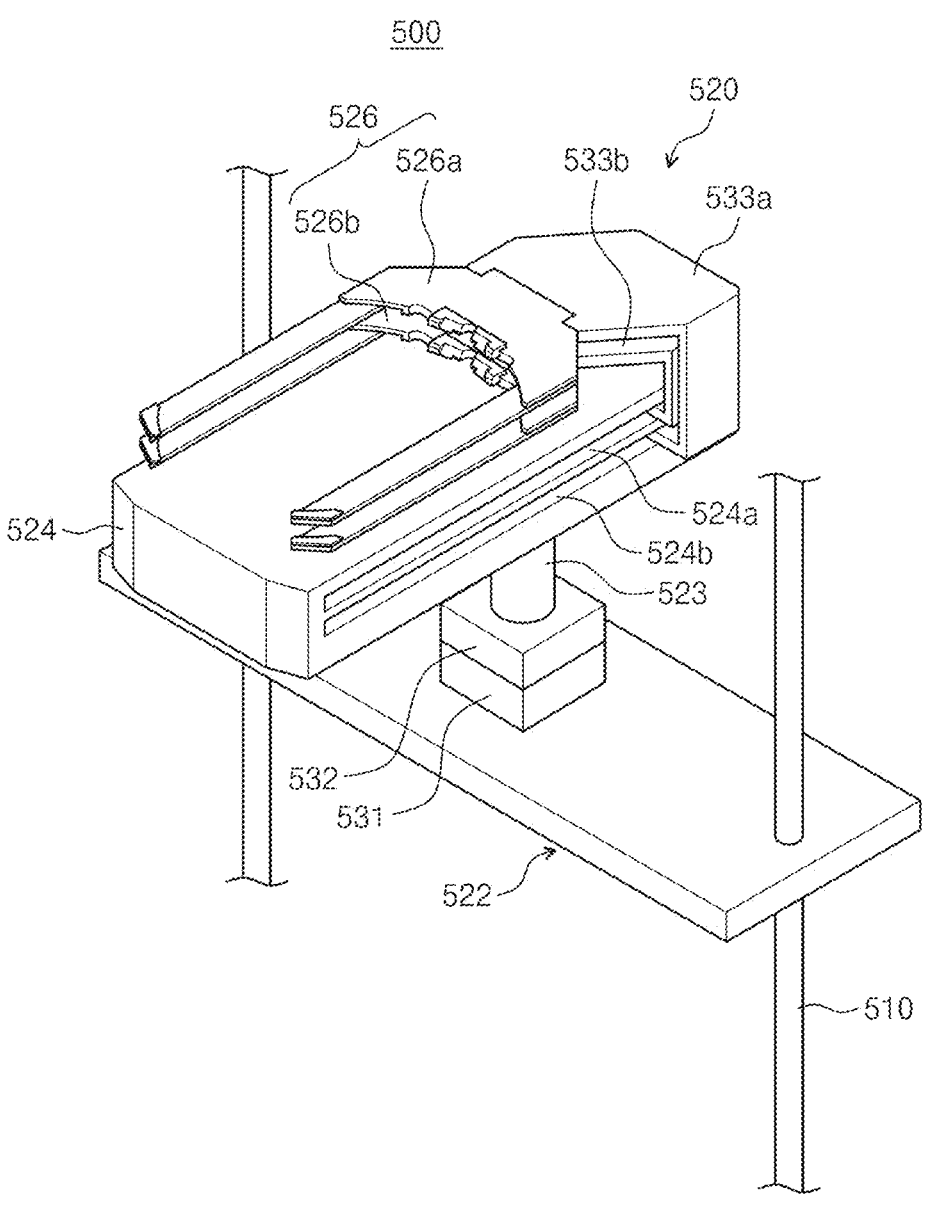
FIG. 5 schematically illustrates an example of a first main transfer robot.

FIG. 5 schematically illustrates an example of a first main transfer robot. The first main transfer robot 520a has a driving block 522, a base plate 524, and a hand 526.

The driving block 522 is installed on the guide rail 510, and is linearly moved along the guide rail 510 in a direction parallel to the third direction 96. The base plate 524 is installed on the driving block 522 by the support shaft 523. The support shaft 523 is mounted on the driving block 522 so as to be rotatable based on a central axis thereof by a rotation driver 531. For example, the rotation driver 531 may be a motor. In addition, the support shaft 523 may be provided to be movable in the longitudinal direction of the support shaft 523 by a vertical driver 532. For example, the vertical driver 532 may be a cylinder or a motor.

The hand 526 supports the substrate W. A plurality of hands 526 are provided. The hand 526 is installed on the base plate 524 to move linearly forward and backward. The plurality of hands 526 are provided. For example, two hands 526 may be provided. The hands 526 are disposed to face each other in the vertical direction. The hands 526 are provided to be spaced apart from each other in the vertical direction. A hand disposed in an upper part among the hands 526 refers to a first hand 526a, and a hand disposed in a lower part among the hands 526 refers to a second hand 526b. The first hand 526a and the second hand 526b are provided to move forward or backward independently of each other. The first hand 526a is coupled to a first bracket 533a. The second hand 526b is coupled to a second bracket 533b. A first guide hole 524a and a second guide hole 524b are formed on a side part of the base plate 524. The first guide hole 524a and the second guide hole 524b are formed to be spaced apart from each other in the vertical direction. The first bracket 533a is coupled to the base plate 524 through the first guide hole 524a, and is moved forward and backward along the first guide hole 524a by the first driver (not illustrated). The second bracket 533b is coupled to the base plate 524 through the second guide hole 524b, and is moved forward and backward along the second guide hole 524b by a second driver (not illustrated). A motor may be used as the first driver and the second driver.

Due to the above-described structure, the first main transfer robot 520a is not linearly moved in a direction parallel to the first direction 92 or in the direction parallel to the second direction 94 in the first transfer chamber 501, but is fixed in a predetermined position when viewed from the third direction 96.

The treating chamber 600 performs a predetermined treatment on the substrate W. According to the exemplary embodiment, the predetermined treatment may be a cleaning treatment in which foreign substances on the substrate W are removed. The treating chamber 600 includes a first cleaning chamber 601 and a second cleaning chamber 602.

The first cleaning chamber 601 is disposed adjacent to the first transfer chamber 501. Based on the first transfer chamber 501, the index frame 14 is disposed on one side of the first transfer chamber 501, and the first cleaning chamber 601 is disposed on the other side of the first transfer chamber 501. When viewed from the top, the index frame 14, the first transfer chamber 501, and the first cleaning chamber 601 are sequentially arranged in the direction parallel to the first direction 92. According to the exemplary embodiment, a plurality of first cleaning chambers 601 are provided. For example, two first cleaning chambers 601 may be provided. A plurality of first cleaning chambers 601 are disposed to be stacked in the vertical direction. the plurality of first cleaning chambers 601 have the same structure and may treat the same type of substrate.

The second cleaning chamber 602 is disposed adjacent to the second transfer chamber 502. Based on the second transfer chamber 502, the index frame 14 is placed on one side of the second transfer chamber 502, and the second cleaning chamber 602 is placed on the other side of the second transfer chamber 502. When viewed from the top, the index frame 14, the second transfer chamber 502, and the second cleaning chamber 602 are sequentially arranged in the direction parallel to the second direction 94. According to the exemplary embodiment, a plurality of second cleaning chambers 602 are provided. The plurality of second cleaning chambers 602 are disposed to be stacked in the vertical direction. The plurality of second cleaning chambers 602 have the same structure and may treat the same type of substrate W. In addition, the first cleaning chambers 601 and the second cleaning chambers 602 have the same structure and may perform the same type of substrate W treatment. Due to the above-described arrangement, the first cleaning chamber 601 and the second cleaning chamber 602 are disposed in the direction parallel to the second direction 94 and spaced apart from each other when viewed from the top.

A space between the first cleaning chamber 601 and the second cleaning chamber 602 is provided as a component accommodation space 700. According to the exemplary embodiment, the components stored in the component accommodation space 700 may be electrical components or valve units. Alternatively, the components may be various types of components used in the liquid supply system in addition to electrical equipment or valve units. Alternatively, the space between the first cleaning chamber 601 and the second cleaning chamber 602 may be provided as a passage which an operator enters during maintenance of the buffer unit 400, the inversion unit 300, the first cleaning chamber 601, or the second cleaning chamber 602. In this case, a door (not illustrated) may be installed on a surface facing the component accommodation space 700 in the buffer unit 400, the inversion unit 300, the first cleaning chamber 601, or the second cleaning chamber 602 such that the operator can access an inner space thereof in the component accommodation space 700.

The buffer unit 400 provides a space in which the substrate W transferred between the container 80 and the treating chamber 600 temporarily stays. The buffer unit 400 has a main buffer 401 and a sub buffer 402. The substrate W immediately after being taken out of the container 80 temporarily stays in the main buffer 401. In addition, the substrate W immediately before being taking into the container 80 temporarily stays in the main buffer 401.

Figure 6:
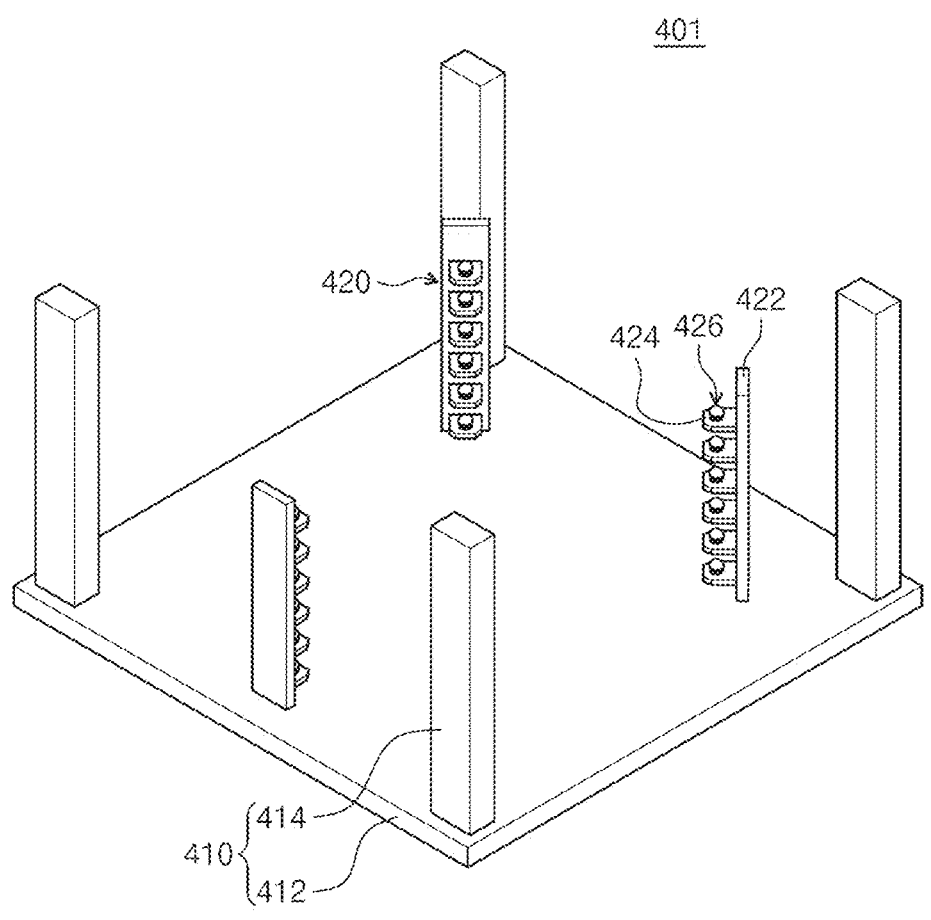
FIG. 6 is a perspective view schematically illustrating a structure of a main buffer.
Figure 7:
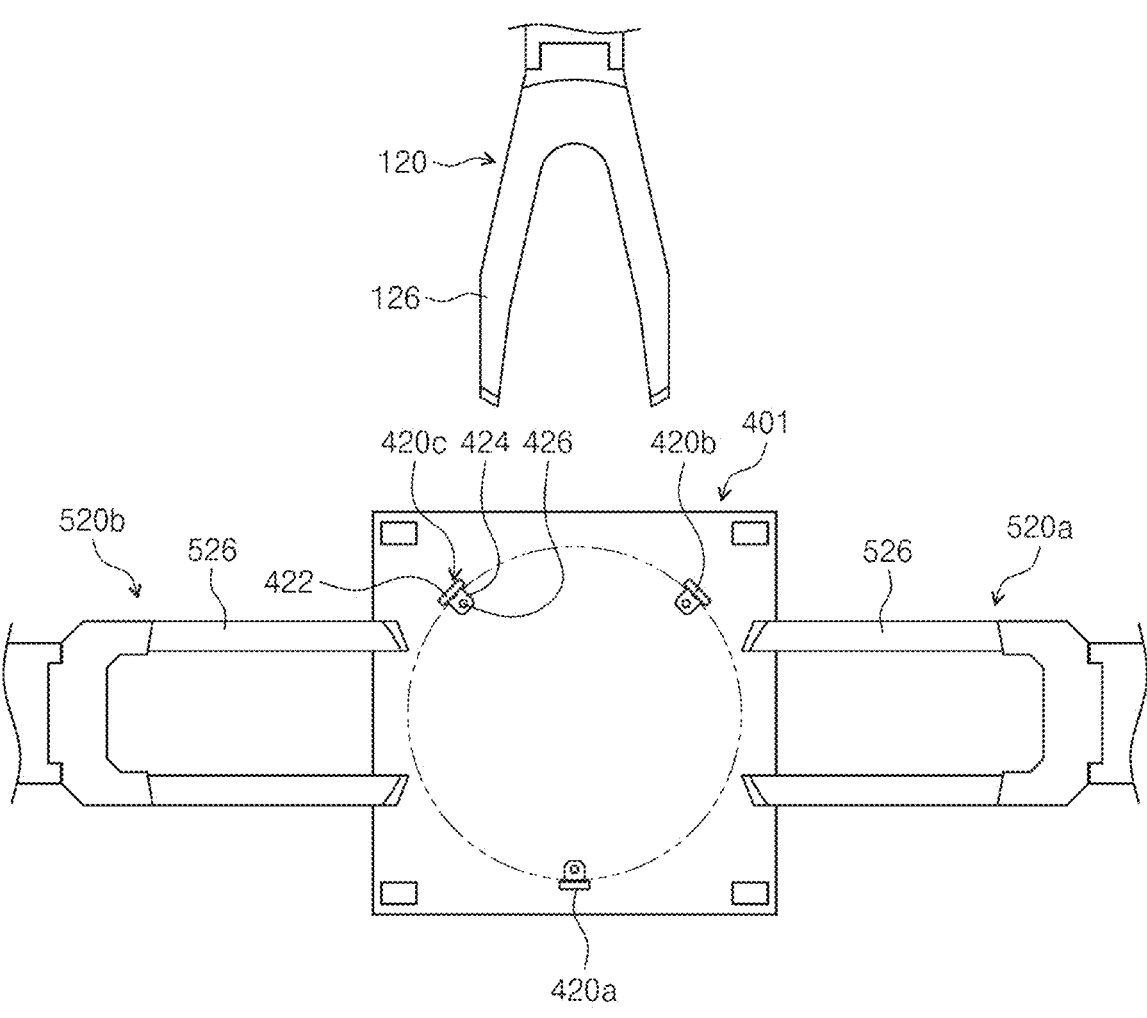
FIG. 7 is a top plan view of the main buffer of FIG. 6.

FIG. 6 is a perspective view schematically illustrating a structure of a main buffer, and FIG. 7 is a top plan view of the main buffer of FIG. 6. Referring to FIGS. 6 and 7, the main buffer 401 includes a frame 410 and a support 420. The frame 410 has a bottom plate 412 and a support column 414. When viewed from the top, the bottom plate 412 may be provided in a substantially rectangular shape. The support column 414 is installed on four corners of the bottom plate 412, respectively. The support column 414 may support the sub buffer 402 disposed above the main buffer 401. A space between the support columns 414 is provided as a movement passage of the hand 526 of the main transfer robot 520 or the hand 126 of the index robot 120.

The support 420 is installed on a bottom plate 410. Three supports 420 are provided. The supports 420 are installed in a space surrounded by the support columns 414. The supports 420 are combined with each other to support the substrate W taken into the main buffer 401. The supports 420 may be provided in the same structure. Hereinafter, the three supports 420 refer to a first support 420a, a second support 420b, and a third support 420c, respectively. The first support 420a may be disposed in an area adjacent to the component accommodation space 700. The second support 420b may be disposed in an area adjacent to an edge where a surface facing the index frame 14 and a surface facing the first transfer chamber 501 intersect in the main buffer 401. The third support 420c may be disposed in an area adjacent to an edge where the surface facing the index frame 14 and a surface facing the second transfer chamber 502 intersect in the main buffer 401.

Due to the above-described structure, the hand 126 of the index robot 120 may be moved to a space between the second support 420b and the third support 420c, the hand 526 of the first robot 520a may be moved to a space between the first support 420a and the second support 420b, and the hand 526 of the second main transfer robot 520b may be moved to a space between the first support 420a and the third support 420c.

According to the exemplary embodiment, each of supports 420 has a vertical rod 422, an inner protrusion 424, and a support pin 426. A longitudinal direction of the vertical rod 422 is provided in the vertical direction. A plurality of inner protrusions 424 are disposed in the longitudinal direction of the vertical rod 422. For example, eight inner protrusions 424 may be provided to each of vertical rods 422. The inner protrusions 422 are disposed to be spaced apart from each other in the vertical direction. The support pin 426 is installed on an upper surface of the inner protrusion 424. One support pin 426 may be installed on each of the inner protrusions 424.

The sub buffer 402 is disposed to be stacked with the main buffer 401. According to the exemplary embodiment, the sub buffer 402 may be disposed above the main buffer 401. During the transferring of the substrate W from the treatment 20, the substrate W may temporarily stay in the sub buffer 402 immediately after the substrate W is taken into the main buffer 401 from the container 80 and immediately before the substrate W is taken into the container 80 from the main buffer 401. According to the exemplary embodiment, when the substrate W is transferred to one of the main buffer 401, the inversion unit 300, and the treating chamber 600, the substrate W may temporarily stay in the sub buffer 402 if it is difficult to transfer the substrate W directly to the main buffer 401, the inversion unit 300, and the treating chamber 600 corresponding to transfer target points.

Figure 8:
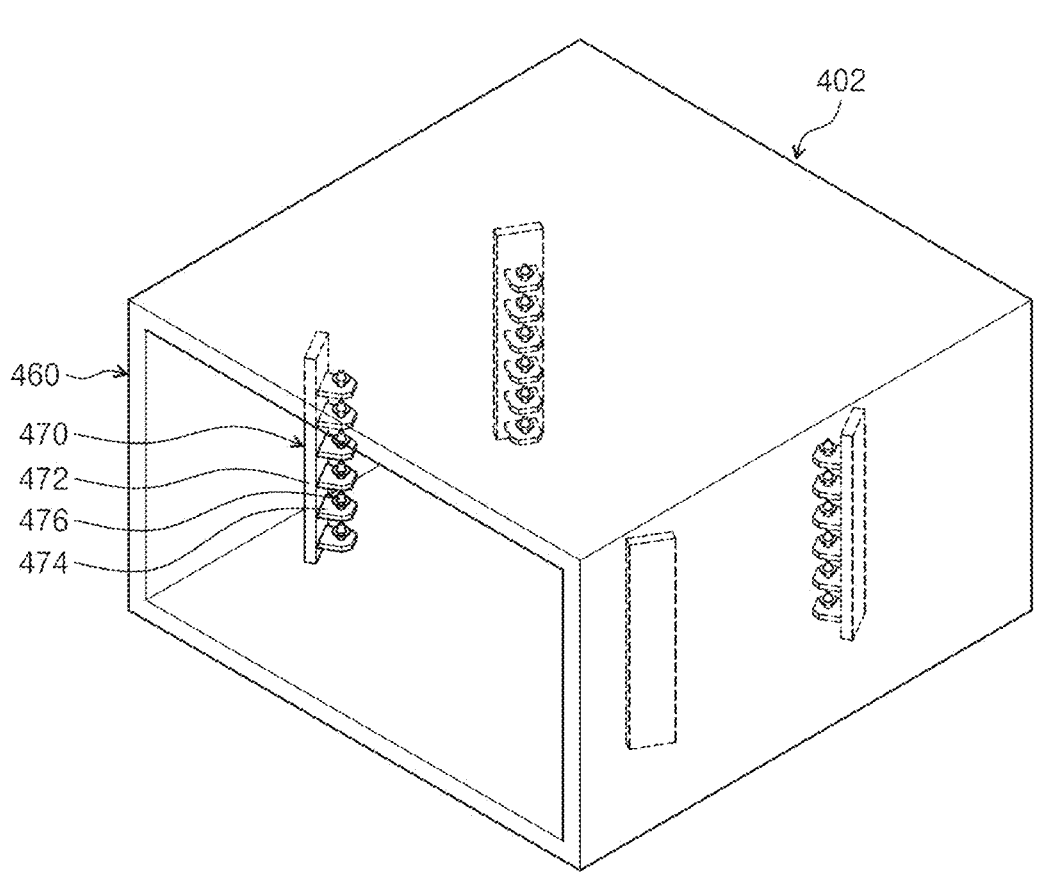
FIG. 8 is a perspective view schematically illustrating a sub buffer.
Figure 9:
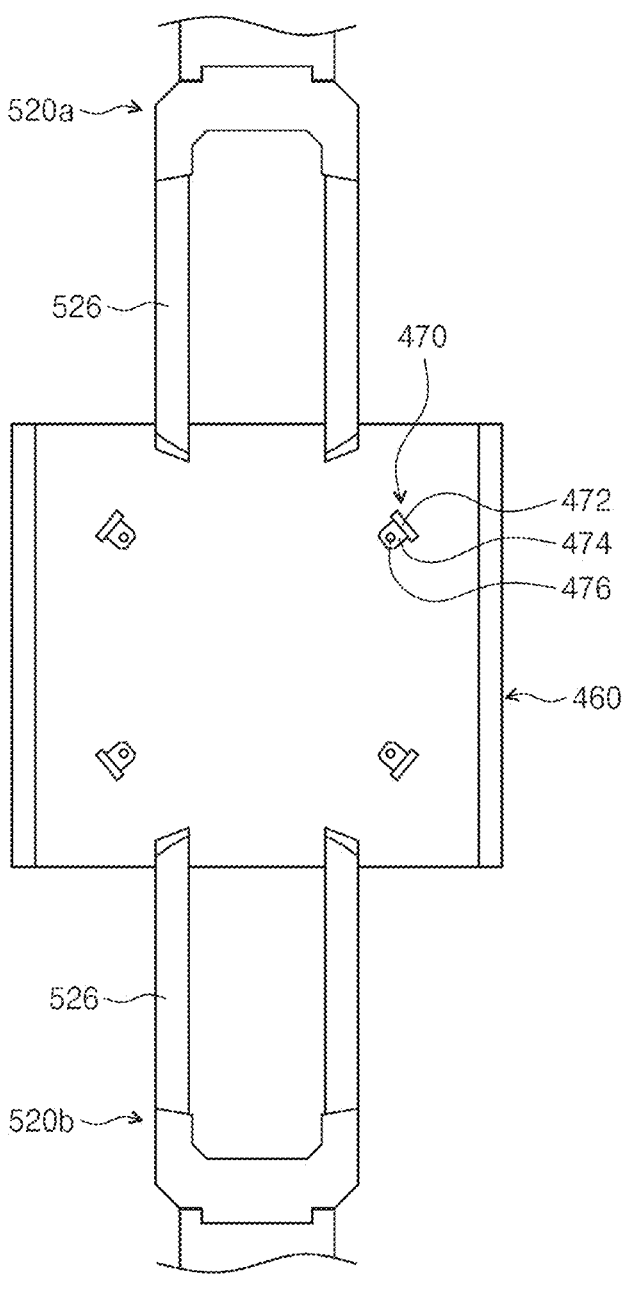
FIG. 9 is a top plan view of the sub buffer of FIG. 8.

FIG. 8 is a perspective view schematically illustrating a sub buffer, and FIG. 9 is a top plan view of the sub buffer of FIG. 8. Referring to FIGS. 8 and 9, the sub buffer 402 includes a housing 460 and a support 470. The housing 460 may be provided in a substantially rectangular parallelepiped shape. In the housing 460, a surface facing the first transfer chamber 501 and a surface facing the second transfer chamber 502 may be opened. A surface facing the index frame 14 in the housing 460 and a surface facing the component accommodation space 700 may be provided as blocking walls. The support 470 is disposed in the housing 460. Four supports 470 may be provided. The supports 470 may be disposed in four edge areas of the housing, respectively.

According to the exemplary embodiment, the support 470 has a vertical rod 472, an inner protrusion 474, and a support pin 476. A longitudinal direction of the vertical rod 472 is provided in the vertical direction. A plurality of inner protrusions 474 are disposed in the longitudinal direction of the vertical rod 472. For example, four inner protrusions 474 may be provided in each of the vertical rods 472. The inner protrusions 474 are disposed to be spaced apart from each other in the vertical direction. The support pin 476 is installed on an upper surface of the inner protrusion 474. One support pin 476 may be installed on each of the inner protrusions 474.

Figure 10:
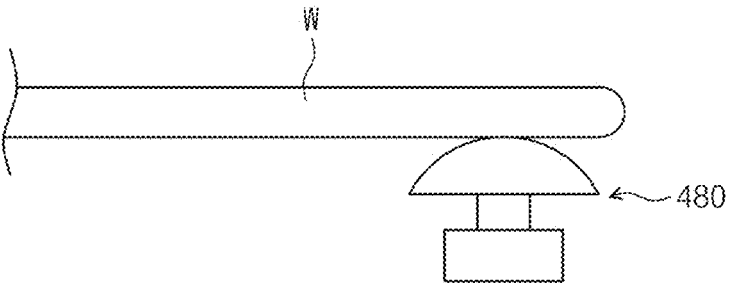
FIG. 10 is a cross-sectional view schematically illustrating an example of a support pin provided in the main buffer or the sub buffer.

FIG. 10 is a cross-sectional view schematically illustrating an example of a support pin provided in the main buffer or the sub buffer. Referring to FIG. 10, the support pin 480 supports a bottom surface of the substrate W. An upper end of the support pin 480 may be provided in a shape convex in an up direction. For example, the upper end of the support pin 480 may be provided in a hemispherical shape. The substrate W may be in contact with the upper end of the support pin 480.

Figure 11:
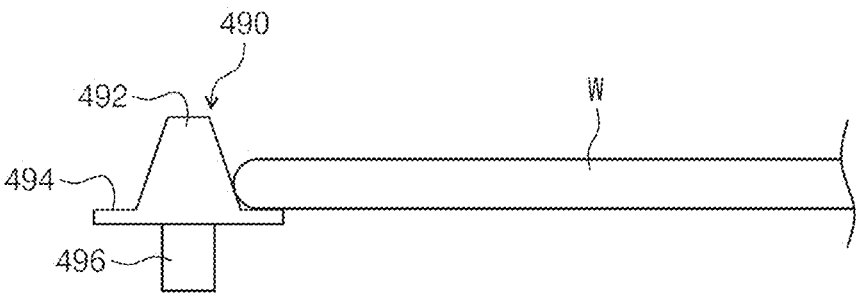
FIG. 11 is a cross-sectional view schematically illustrating another example of a support pin provided in a main buffer or a sub buffer.

FIG. 11 is a cross-sectional view schematically illustrating another example of a support pin provided to a main buffer or a sub buffer. Referring to FIG. 11, the support pin 490 supports the substrate W and aligns the substrate W. The support pin 490 has an upper body 492, a contact surface 494, and a lower body 496. The contact surface 494 supports an edge of a lower surface of the substrate W. The contact surface 494 may be provided in a circular shape when viewed from the top. The upper body 492 protrudes upward from the contact surface 494. A bottom surface of the upper body 492 is provided to have a diameter smaller than that of the contact surface. An upper surface of the upper body 492 is provided to have a diameter smaller than the bottom surface of the upper body 492. When viewed from the top, the upper body 492 and the contact surface 494 may be provided concentrically. When viewed from the front, a side part of the upper body 492 is provided as an inclined surface. For example, the upper body 492 may be provided in a conical shape. The lower body 496 protrudes downward from the contact surface 494. The lower body 496 is fixedly installed on the inner protrusions 424 and 474. The inclined surface guides a downward movement of the substrate W so that the substrate W can be placed normally on the contact surface even when the substrate W is taken into the sub buffer 402 in a state where the substrate W is out of position.

In the structure of the support pin 480 of FIG. 10, the substrate is supported by the upper end of the support pin. Accordingly, the structure of the support pin 480 of FIG. 10 may provide a narrower vertical gap between the inner protrusions than the structure of the support pin 490 of FIG. 11. Accordingly, a larger number of inner protrusions may be provided within a space limited in the vertical direction.

In the structure of the support pin 490 of FIG. 11, the inclined surface may align the position of the substrate W. Accordingly, the structure of the support pin 490 in FIG. 11 may align the substrate W whose position is twisted on the hand during the transfer as compared to the structure of the support pin 480 in FIG. 10.

According to the exemplary embodiment, the support pin 426 in the main buffer 401 and the support pin 476 in the sub buffer 402 may be provided in the same structure as the support pin 480 in FIG. 10. Alternatively, the support pin 426 in the main buffer 401 and the support pin 476 in the sub buffer 402 may be provided in the same structure as the support pin 490 in FIG. 11. Alternatively, the support pin 426 in the main buffer 401 may be provided in one of the structures of the support pin 480 of FIG. 10 and the support pin 490 of FIG. 11, and the support pin 476 in the sub buffer 402 may be provided in the other of the structures of the support pin 480 of FIG. 10 and the support pin 490 of FIG. 11.

According to the exemplary embodiment, since both the substrate W immediately after being taken out of the container 80 and the substrate W immediately before being taken into the container 80 are stored in the main buffer 401, the support pin 426 of the main buffer 401 may be provided in the same structure as the support pin 480 of FIG. 10 so that a larger number of inner protrusions 424 can be provided in the vertical direction from the main buffer 401, which is relatively frequently used. In addition, for the sub buffer 402, which is relatively infrequently used, the support pin 476 in the sub buffer 402 may be provided in the same structure as the support pin 490 of FIG. 11 having an alignment function so as to correct the twisted position of the substrate W during the transfer of the substrate W.

The inversion unit 300 inverts the positions of the pattern surface and the non-pattern surface of the substrate W. The inversion unit 300 is disposed above the buffer unit 400. According to the exemplary embodiment, the inversion unit 300 may be disposed above the sub buffer 402. A plurality of inversion units 300 may be provided. For example, two inversion units 300 may be provided. The plurality of inversion units 300 may be disposed to be stacked on each other. The plurality of inversion units 300 may be disposed adjacent to each other.

Figure 12:
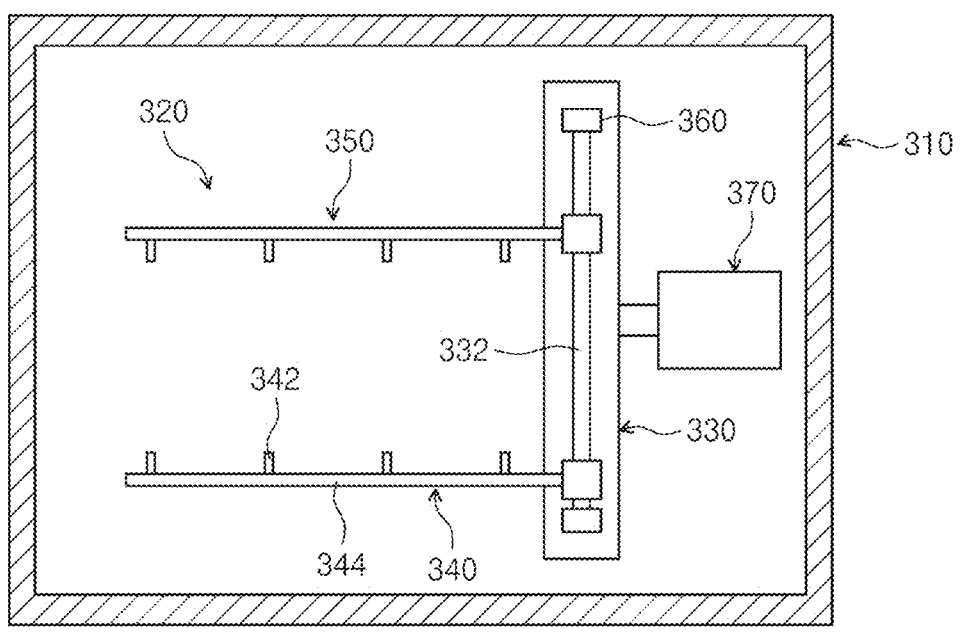
FIG. 12 is a cross-sectional view schematically illustrating a structure of an inversion unit.

FIG. 12 is a cross-sectional view schematically illustrating a structure of the inversion unit. The inversion unit 300 has a housing 310 and an inversion member 320. The housing 310 has a substantially rectangular parallelepiped shape. Among the side surfaces of the housing 310, an entrance (not illustrated) through which the substrate W is taken in may be formed on a side surface facing the first transfer chamber 501 and a side facing the second transfer chamber 502. The inversion member 320 is disposed in the housing 310.

The inversion member 320 has a rotation body 330, a first gripper 340, a second gripper 350, a straight-line driver 360, and a rotation driver 370. The first gripper 340 and the second gripper 350 are mounted in the rotation body 330. The first gripper 340 is disposed to face the second gripper 350 in the vertical direction. The first gripper 340 and the second gripper 350 are installed in the rotation body 330 to change a spacing distance therebetween. The straight-line driver 360 moves the first gripper 340 and the second gripper 350 such that the spacing distance between the first gripper 340 and the second gripper 350 changes depending on a contact position and a spacing position. The contact position is a position where the first gripper 340 and the second gripper 350 combine and grip the substrate W placed between the first gripper 340 and the second gripper 350. The spacing position is a position where a gap between the first gripper 340 and the second gripper 350 is widened such that the substrate W can be takin in or out between the first gripper 340 and the second gripper 350. According to the exemplary embodiment, the first gripper 340 and the second gripper 350 are installed in the rotation body 330 so that a distance between the gripper 340 and the first gripper 340 and the second gripper 350 may be adjusted.

According to the exemplary embodiment, the first gripper 340 has a support 342 and a grip pin 344. The support 342 is installed on the rotation body 330. The support 342 may be provided in a disk shape. Alternatively, the support 342 may be provided in a substantially ring shape. The grip pin 344 is coupled to the support 342. According to the exemplary embodiment, four grip pins 344 are provided. The grip pin 344 supports an end of the substrate W while inversion is performed. According to the exemplary embodiment, the grip pin 344 has a contact surface with a guide surface. The contact surface is disposed inside the guide surface. The contact surface may be provided as an inclined surface inclined toward the guide surface. The guide surface is disposed outside the substrate W inverted by the inversion member 320. The guide surface prevents the substrate W from deviating from the inversion member 320 during the inversion. The second gripper 350 has the same structure as the first gripper 340. The first gripper 340 and the second gripper 350 may be provided in a structure symmetrical to each other with respect to the substrate W supported therebetween. The rotation driver 370 rotates the rotation body 330.

Figure 13:
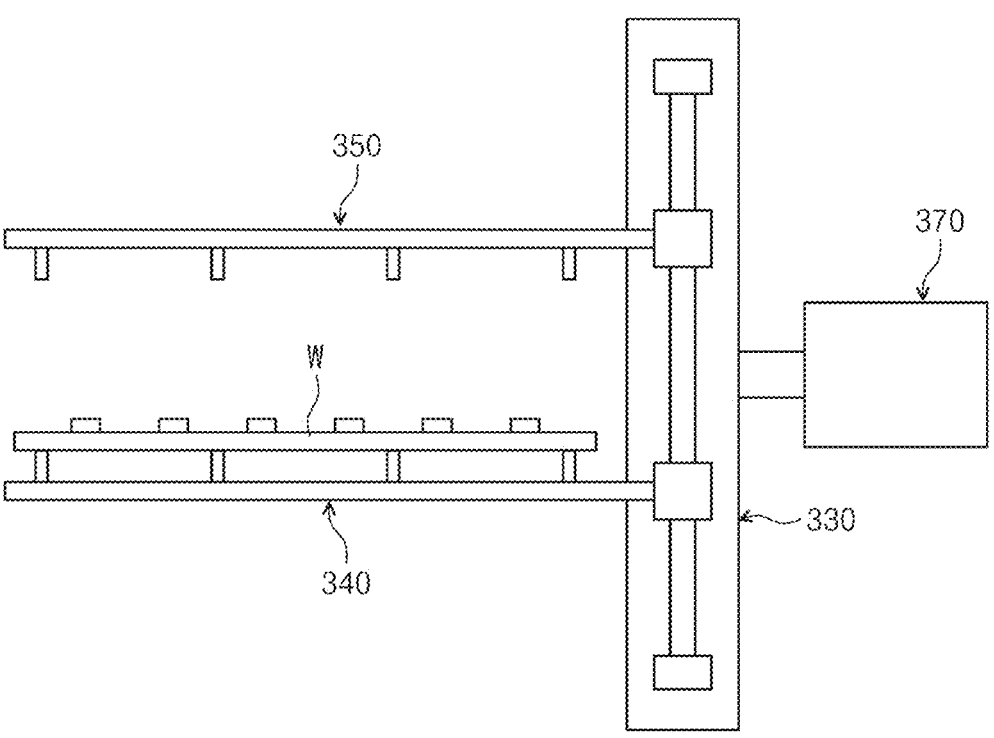
FIGS. 13 to 16 are views sequentially illustrating an example of an operation in which the substrate is inverted by the inversion unit.
Figure 14:
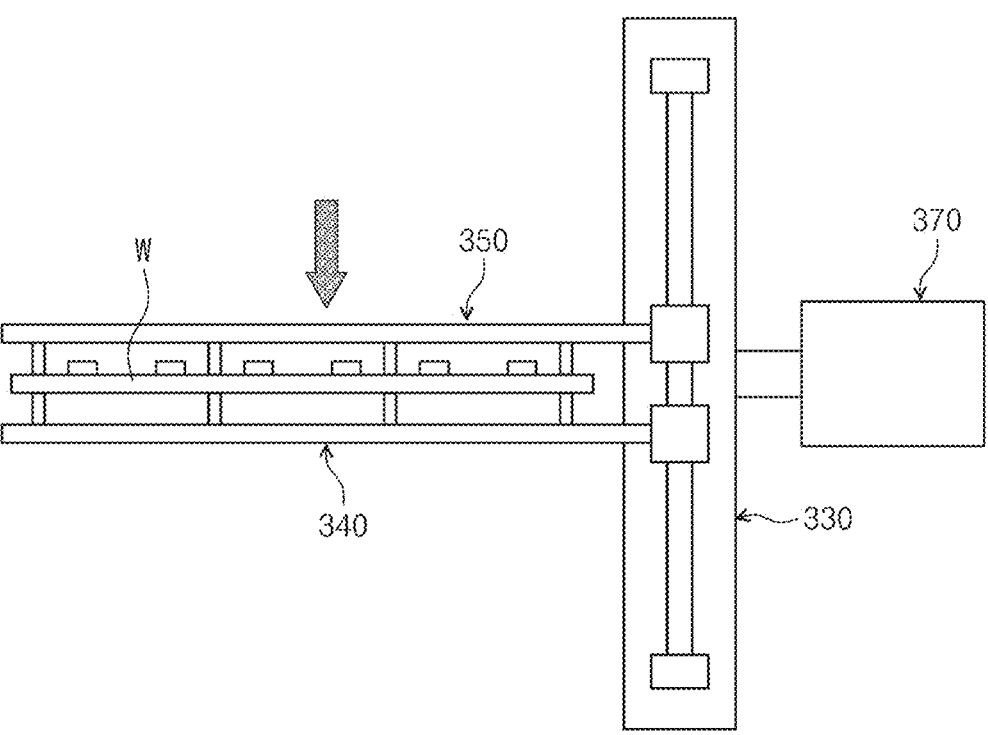
Figure 15:
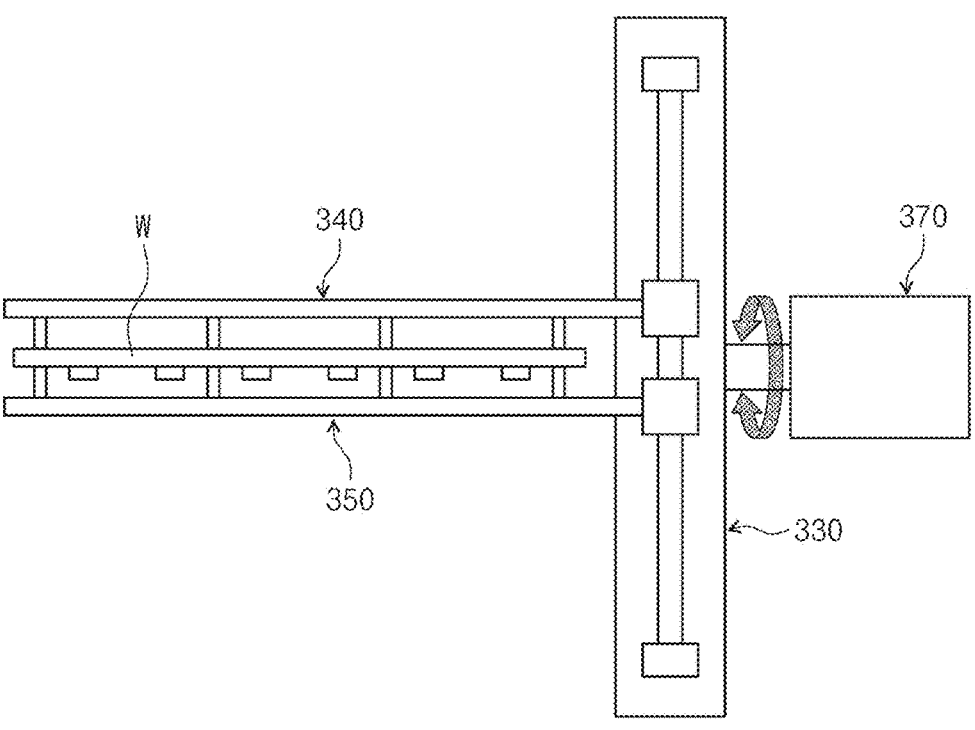
Figure 16:
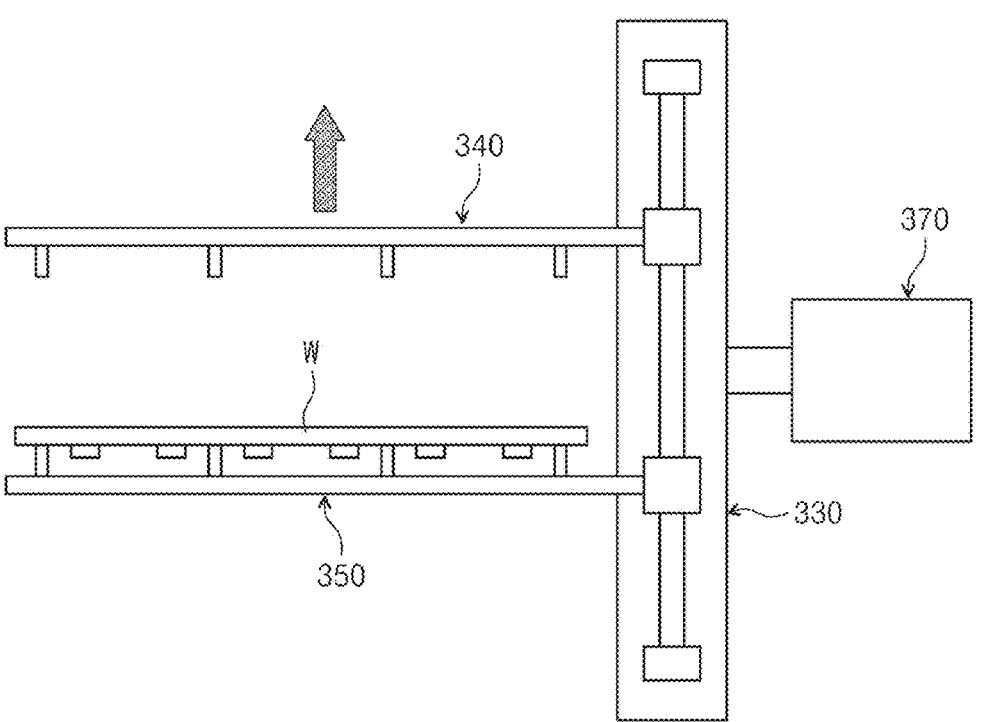

FIGS. 13 to 16 sequentially illustrate an example of an operation in which the substrate is inverted by the inversion unit. First, as illustrated in FIG. 13, the substrate W is transferred between the first gripper 340 and the second gripper 350 in a state where the first gripper 340 and the second gripper 350 are spaced apart from each other. In this case, the substrate W may be disposed such that the pattern surface thereof faces upwardly. Then, as illustrated in FIG. 14, the first gripper 340 and the second gripper 350 are moved such that the first gripper 340 and the second gripper 350 are disposed in the contact position, and the substrate W is gripped by the first gripper 340 and the second gripper 350. Then, as illustrated in FIG. 15, the rotation driver 370 rotates the rotation body 330. By the rotation of the rotation body 330, the positions of the first gripper 340 and the second gripper 350 are changed in the vertical direction, and the pattern of the substrate W disposed between the first gripper 340 and the second gripper 350 is disposed to face downward. Then, as illustrated in FIG. 16, the first gripper 340 and the second gripper 350 are moved such that the first gripper 340 and the second gripper 350 are disposed in the spacing position, and the substrate W is transferred from the inversion unit 300 to the outside by the first main transfer robot 520a or the second main transfer robot 520b.

The first cleaning chamber 601 and the second cleaning chamber 602 clean the substrate W. The first cleaning chamber 601 and the second cleaning chamber 602 may be provided in the same structure and may perform the same kind of process. According to the exemplary embodiment, the first cleaning chamber 601 performs a first process and a second process on the substrate W. The first process is a process of treating the substrate W in a state in which the non-pattern surface of the substrate W is disposed to face upwardly. The second process is a process of treating the substrate W in a state in which the pattern surface of the substrate W is disposed to face upwardly.

According to the exemplary embodiment, the first process includes a process of cleaning the non-pattern surface of the substrate W using a brush. In addition, the first process may include an additional process performed on the non-pattern surface of the substrate W before cleaning the non-pattern surface of the substrate W with the brush or after cleaning the non-pattern surface of the substrate W with the brush. For example, the first process may include a process of supplying a treatment liquid to the non-pattern surface of the substrate W to treat the non-pattern surface of the substrate W, and/or a process of drying the non-pattern surface of the substrate W of the substrate W, after cleaning the non-pattern surface of the substrate W with the brush. The treatment liquid may include a solvent such as chemicals, water, or alcohol. In addition, while cleaning the non-pattern surface of the substrate W using the brush, the treatment liquid may be supplied to the non-pattern surface of the substrate W.

The second process includes a process of cleaning the pattern surface of the substrate W using the treatment liquid. In addition, the second process may include a drying process in which the treatment liquid is removed from the pattern surface of the substrate W after cleaning the pattern surface of the substrate W with the treatment liquid. The treatment liquid may include chemicals, water, or alcohol. For example, the second process may include a removal process of removing foreign substances or thin films from the pattern surface of the substrate W by supplying the chemicals to the pattern surface of the substrate W, a rinsing process of supplying water to the pattern surface of the substrate W and removing the chemicals with water from the pattern of the substrate W, and a replacement process of supplying an organic solvent such as isopropyl alcohol to the pattern surface of the substrate W and replacing water with the organic solvent. Alternatively, one of the rinsing process and the replacement process may be omitted. In addition, the removing process may be sequentially performed multiple times by using different types of chemicals.

Figure 17:
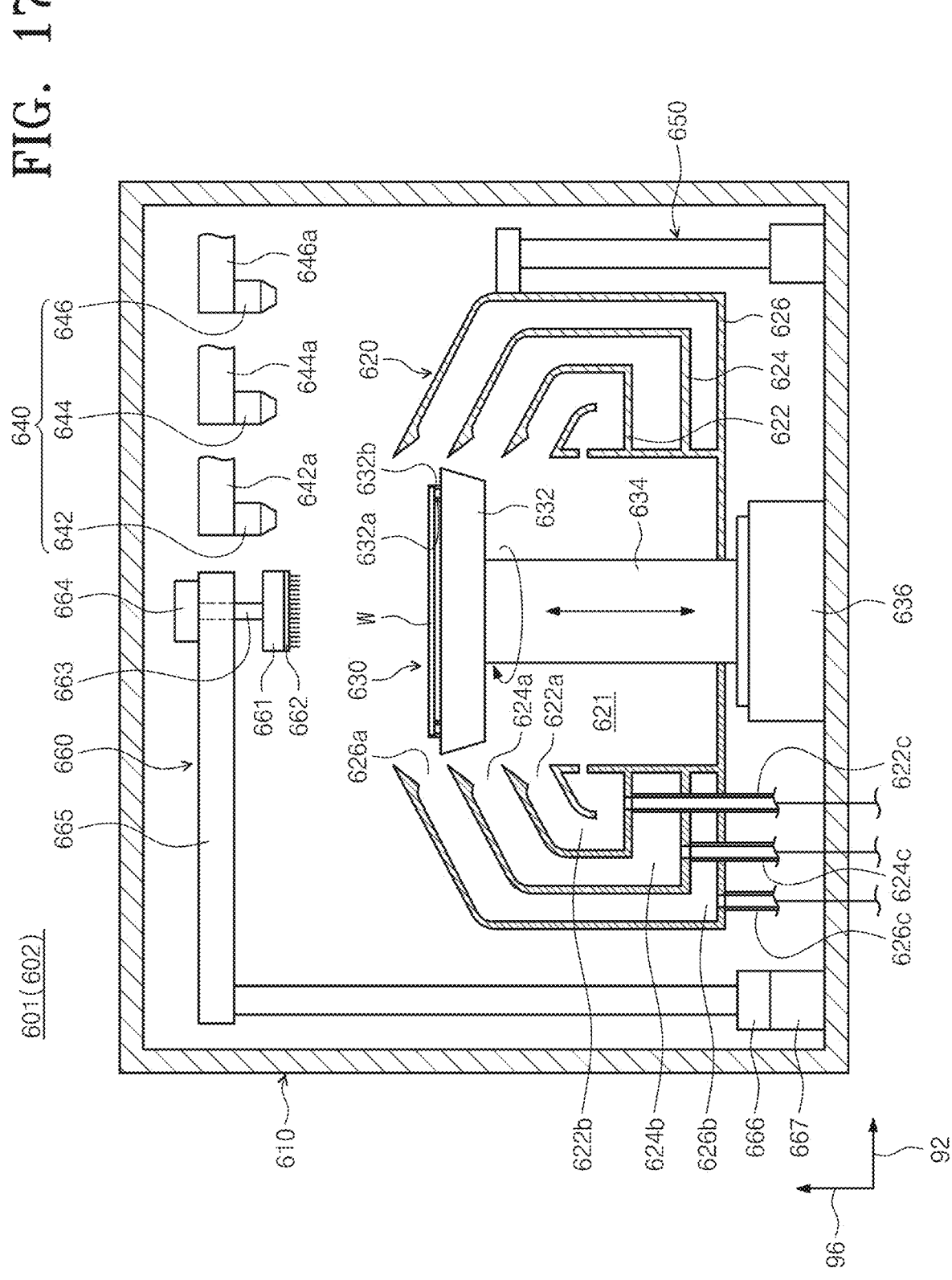
FIG. 17 is a cross-sectional view schematically illustrating an example of a first cleaning chamber.

FIG. 17 is a cross-sectional view schematically illustrating an example of a first cleaning chamber. The first cleaning chamber 601 has a housing 610, a cup 620, a support unit 630, a liquid supply unit 640, an elevating unit 650 and a brush unit 660.

The housing 610 is generally provided in a rectangular parallelepiped shape. A take-in inlet (not illustrated) in which the substrate W is taken is formed on a surface of the housing 610 facing the first transfer chamber 501. The substrate W is taken in or taken out of the housing 610 through the take-in inlet by the first main transfer robot 520a. The cup 620, the liquid supply unit 640, the brush unit 660, and the elevating unit 650 are disposed in the housing 610.

The cup 620 has a treatment space 621 of which an upper part is opened. The substrate W is treated by performing the first process or the second process in the treatment space 621. The support unit 630 supports the substrate W in the treatment space 621. The liquid supply unit 640 supplies the treatment liquid onto the substrate W supported by the support unit 630. The elevating unit 650 adjusts a relative height between the cup 620 and the support unit 630.

According to the exemplary embodiment, the cup 620 has a plurality of collection cylinders 622, 624 and 626. Each of the collection cylinders 622, 624 and 626 has collection spaces 622b, 624b and 626b for recovering the liquid used for treating the substrate W. Each of the collection cylinders 622, 624, and 626 is provided in a ring shape surrounding the support unit 630. During the process of treating the liquid, the treatment liquid scattered by the rotation of the substrate W flows into a collection space through inlets 622a, 624a and 626a of each collection cylinders 622, 624 and 626. According to the exemplary embodiment, the cup 620 has a first collection cylinder 622, a second collection cylinder 624, and a third collection cylinder 626. The first collection cylinder 622 is arranged to surround the support unit 630, the second collection cylinder 624 is arranged to surround the first collection cylinder 622, and the third collection cylinder 626 is arranged to surround the second collection cylinder 624. The second inlet 624b flowing into the second collection cylinder 624 may be disposed above the first inlet 626a flowing into the first collection cylinder 622, and the third inlet 626b flowing into the third collection cylinder 626 may be disposed above the second inlet 624b. Liquid discharge pipes 622c, 624c and 626c are coupled to each of the collection cylinders 622, 624 and 626. The number of collection cylinders may be variously changed according to the number of used treatment liquids and the number of treatment liquids to be recovered or discarded.

The support unit 630 has a spin chuck 632 and a drive shaft 634. An upper surface of the spin chuck 632 is provided in a substantially circular shape and may have a diameter larger than that of the substrate W. A support pin 632a that supports a rear surface of the substrate W is provided in a central part of the spin chuck 632, and an upper end of the support pin 632a is provided to protrude from the spin chuck 632 such that the substrate W is spaced apart from the support plate by a predetermined distance. A chuck pin 632b is provided in an edge of the spin chuck 632. The chuck pin 632b is provided to protrude upward from the support plate. The chuck pin 632b supports the side of the substrate W so that the substrate W does not deviate from the support unit 630 when the substrate W is rotated. The drive shaft 634 is driven by a rotational driver 636, is connected to the center of the bottom surface of the substrate W, and rotates the spin chuck 632 based on a central axis thereof.

The liquid supply unit 640 has a first nozzle 642, a second nozzle 644, and a third nozzle 646. The first nozzle 642 supplies chemicals to the substrate W. The second nozzle 644 supplies water to the substrate W. The water may be pure water or deionized water. The third nozzle 646 supplies an organic solution to the substrate W. The organic solvent may be isopropyl alcohol.

The first nozzle 642, the second nozzle 644, and the third nozzle 646 are supported by different arms 642a, 644a and 646a, respectively. Each of the arms 642a, 644a and 646a is coupled to each driver (not illustrated). Each of the nozzles 642, 644, and 646 may be moved by each of the drivers between a process position and a waiting position. The process position is a position where the nozzles 642, 644 and 646 supply the treatment liquid to the substrate W, and the waiting position is a position where each of the nozzle 642, 644 and 646 waits when the treatment liquid is not supplied to the substrate W. For example, the process position may be a position that overlaps with the cup 620 when viewed from the top, and the waiting position may be an outer region of the cup 620 when viewed from the top. Each of the drivers may swing or linearly move each of the arms 642a, 644a and 646a. Alternatively, the first nozzle 642, the second nozzle 644, and the third nozzle 646 may all be mounted on the same arm and moved at the same time.

The liquid supply unit 640 may further include one or a plurality of nozzles in addition to the first nozzle 642, the second nozzle 644, and the third nozzle 646. The added nozzle may supply different types of treatment liquid to the substrate W.

The brush unit 660 has a body 661, a brush 662, a rotation shaft 663, a rotation driver 664, and a pressing driver 666. The body 661 has a circular plate shape. The body 661 is coupled to the arm 665 by the rotation shaft 663 in one end of the arm 665. The brush 662 is installed on the bottom surface of the body 661. The brush 662 may be provided in a plate shape made of an elastic material. Alternatively, the brush 662 may have a plurality of wools. The rotation driver 664 rotates the body 661 to which the brush 662 is coupled, around the rotation shaft 663 as a central axis. The brush 662 may be moved between the process position and the waiting position by the driver 667. The process position is a position where the substrate W is pressed with the brush 662 and is cleaned, and the waiting position is a position where the brush 662 waits when the substrate W is not treated. For example, the process position may be a position that overlaps with the cup 620 when viewed from the top, and the waiting position may be the outer region of the cup 620 when viewed from the top. The pressing driver 666 presses the brush 662 such that the brush 662 may press the substrate W in a state in which the brush 662 faces the substrate W. A cylinder may be used as the pressing driver 666. Alternatively, a motor may be used as the pressing driver 666. The pressing driver 666 may be provided to press the entire arm 665 including the body 661 downwardly. Alternatively, the pressing driver 666 may be installed on the upper surface of the body 661 to press the body 661 downwardly to the arm 665.

The elevating unit 650 moves the cup 620 in the vertical direction. The relative height between the cup 620 and the substrate W is changed by the vertical movement of the cup 620. Accordingly, since the collection cylinders 622, 624 and 626 that recovers the treatment liquid are changed depending on the type of liquid supplied to the substrate W, the liquids can be separated and recovered. Unlike the above-described arrangements, the cup 620 is fixedly installed, and the elevating unit 650 may move the support unit 630 in the vertical direction.

The second process block 24 has a configuration substantially the same as or similar to that of the first process block 22. The second process block 24 has the buffer unit 400, the inversion unit 300, the treating chambers 600, and the transfer chambers 500. When viewed from the top, the buffer unit 400, the inversion unit 300, the treating chambers 600 and the transfer chambers 500 of the first process block 22 have the same arrangement as the buffer unit 400, the inversion unit 300, the treating chambers 600, and the transfer chambers 500.

However, in the second process block 24, the buffer unit 400 is disposed above the inversion unit 300. In addition, in the buffer unit 400 of the second process block 24, the main buffer 401 is disposed on the sub buffer 402. That is, based on any horizontal plane disposed between the first process block 22 and the second process block 24, the buffer unit 400 and the inversion unit 300 provided in the first process block 22, may be symmetrical to the buffer unit 400 and the inversion unit 300 provided in the second process block 24. Accordingly, the main buffer 401 disposed in the first process block 22 and the main buffer 401 disposed in the second process block 24 are placed adjacent to each other, and the sub buffer 402 and the inversion unit 300 are disposed in a direction away from the main buffer 401.

Hereinafter, in order to distinguish between the components provided in the first process block 22 and the components provided in the second process block 24, the first transfer chamber, the second transfer chamber, the first cleaning chamber, the second cleaning chamber, the first main transfer robot, and the second main transfer robot provided in the second process block 24 refer to a third transfer chamber 503, a fourth transfer chamber 504, a third cleaning chamber 603, a fourth cleaning chamber 604, a third main transfer robot 520c, and a fourth transfer robot 520d, respectively. In addition, the main buffer, the sub buffer, and inversion unit provided in the first process block 22 refer to a first main buffer 401, a first sub buffer 402, and a first inversion unit 300a, and the main buffer, the sub buffer, and the inversion unit provided in the second process block 24 refer to a second main buffer 403, a second sub buffer 404, and a second inversion unit 300b.

According to the exemplary embodiment, the index robot 120 transfers the substrate W between the container 80 placed in the load port 12 and the first main buffer 401, and between the container 80 placed in the load port 12 and the second main buffer 403. The first main buffer 401 and the second main buffer 403 are arranged adjacent to each other, and the index robot 120 transfers the substrate W only between the container 80, the first main buffer 401, and the second main buffer 403. Accordingly, the vertical movement distance of the index robot 120 may be shorter than the movement distance when the first main buffer 401 is far from the second main buffer 403 in the vertical direction.

The first main transfer robot 520a and the second main transfer robot 520b transfer the substrate (W) between the units and the cleaning chamber in the first process block 22. Specifically, the first main transfer robot 520a directly transfers the substrate W between the first main buffer 401, the first sub buffer 402, the first inversion unit 300a, and the first cleaning chamber 601. The second main transfer robot 520b directly transfers the substrate W between the first main buffer 401, the first sub buffer 402, the first inversion unit 300a, and the second cleaning chamber 602. In addition, the third main transfer robot 520c and the fourth main transfer robot 520d transfer the substrate W between the units and the chambers provided in the second process block 24. Specifically, the third main transfer robot 520c directly transfers the substrate W between the second main buffer 403, the second sub buffer 404, the second inversion unit 300b, and the third cleaning chamber 603. The fourth main transfer robot 520d directly transfers the substrate W between the second main buffer 403, the second sub buffer 404, the second inversion unit 300b, and the fourth cleaning chamber 604.

The controller 30 controls the index robot 120, the main transfer robots 520, and the cleaning chambers 400.

Figure 18:
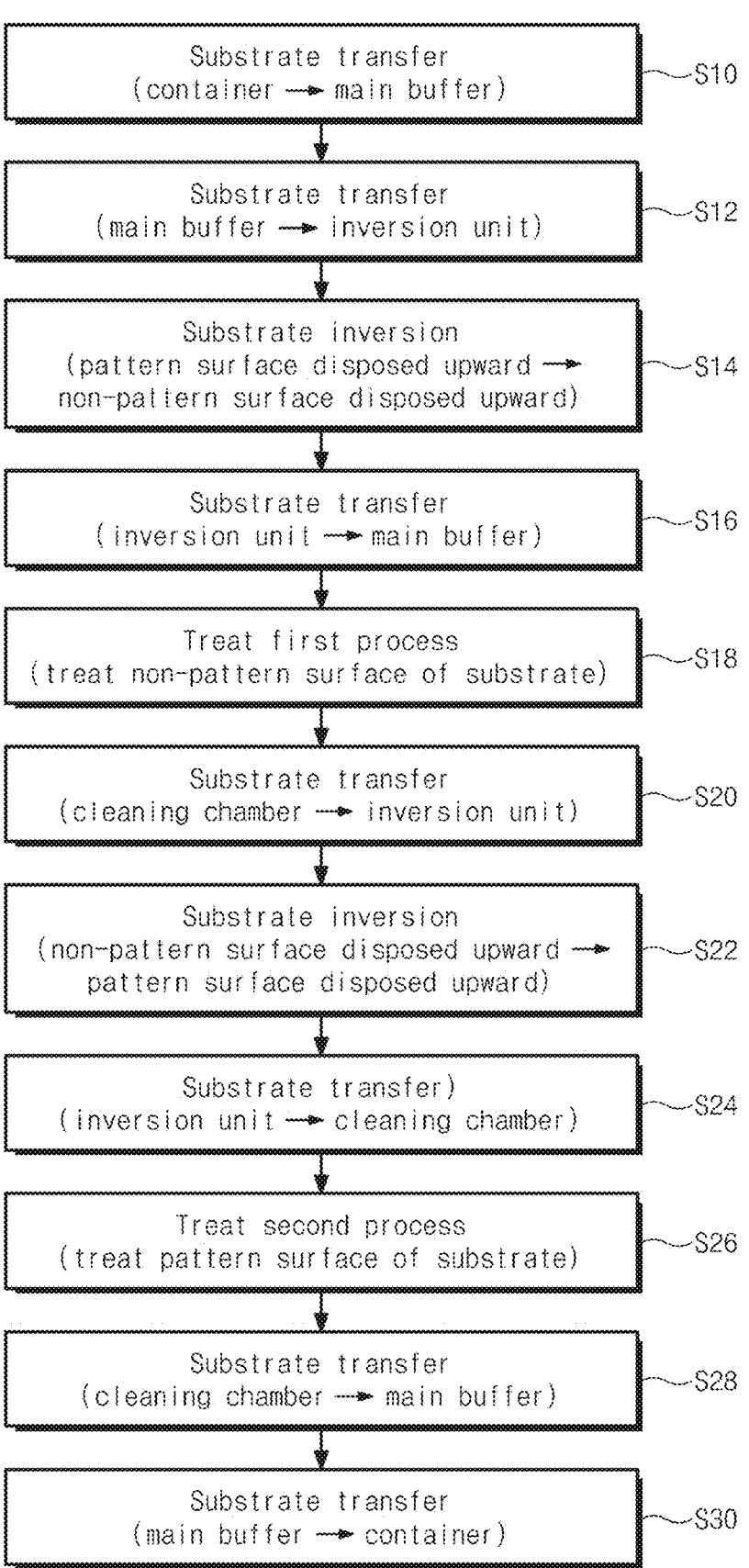
FIG. 18 is a flowchart sequentially illustrating an example of a process of transferring and treating the substrate using the apparatus for treating a substrate of FIG. 1.
Figure 19:
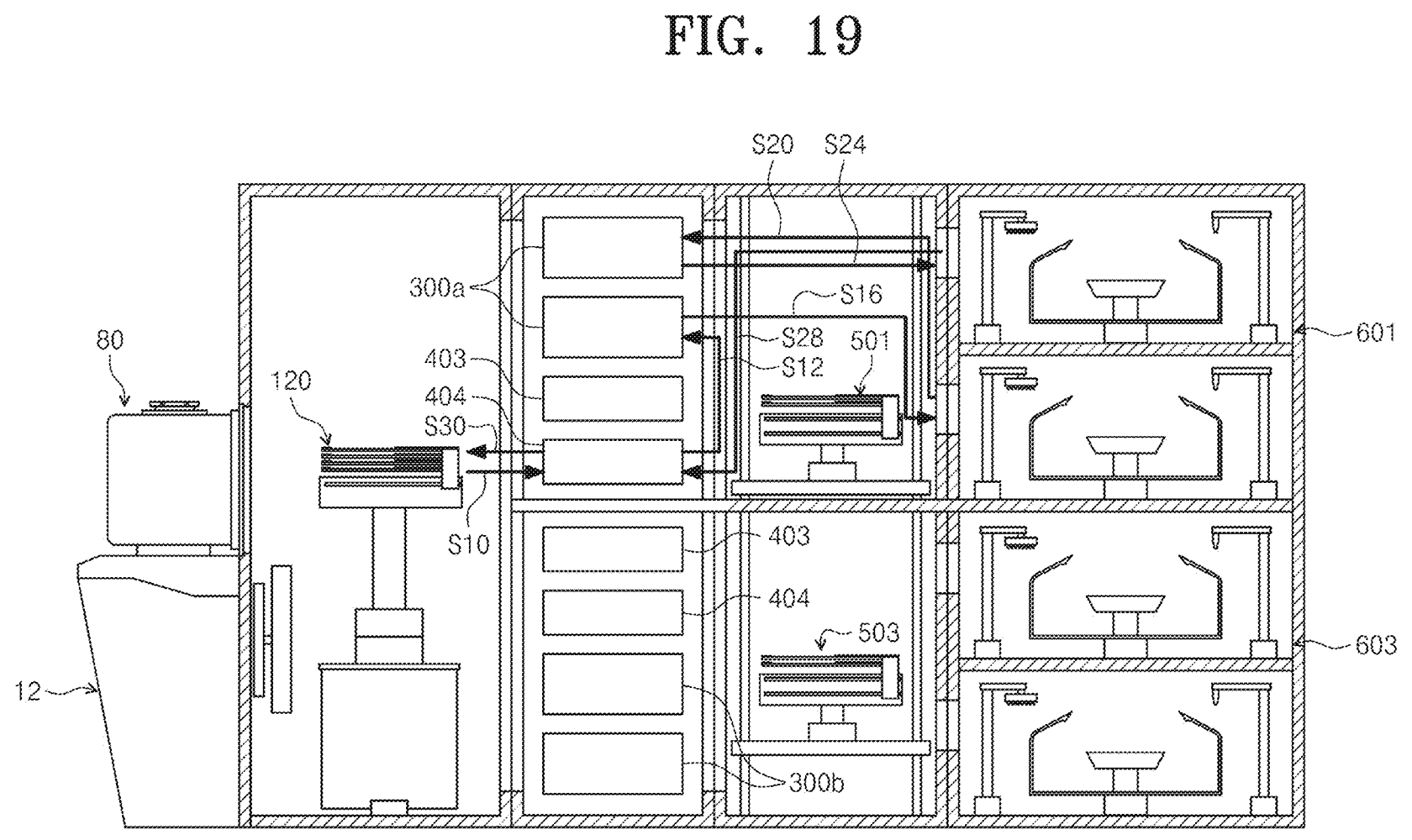

FIG. 18 is a flowchart sequentially illustrating an example of a process of transferring and treating the substrate using the apparatus for treating a substrate of FIG. 1, and FIG. 19 is a view sequentially illustrating a path through which the substrate is transferred in the apparatus for treating a substrate of FIG. 1. In FIG. 19, for convenience of description, it is illustrated that the transfer chamber is disposed between the buffer unit and the inversion unit and the cleaning chamber.

When the container 80 is placed in the load port 12, the index robot 120 takes out a first substrate W1 from the container 80 and takes the first substrate W1 into the first main buffer 401 (step S10). In this case, the first substrate W1 is disposed such that the pattern surface thereof faces upwardly. The first main transfer robot 520a or the second main transfer robot 520b takes out the first substrate W1 from the first main buffer 401 and takes the first substrate W1 into the first inversion unit 300a (step S12). When the others substrates W are supplied to all the first inversion units 300a and the first substrate W1 cannot be taken into the first inversion unit 300a, the first inversion robot 520a or the second inversion robot 520b takes in the first substrate W1 from the first main buffer 401 to the first sub buffer 402. Then, when any one of the first inversion units 300a is empty, the first inversion robot 520a or the second inversion robot 520b returns the first substrate W1 to the first inversion unit 300a which is empty in the sub buffer 402.

In the first inversion unit 300a, the positions of the pattern surface and the non-pattern surface of the first substrate W1 are inversed (step S14). The first main transfer robot 520a takes out the first substrate W1 from the first inversion unit 300a and takes the first substrate W1 into the first cleaning chamber 601 (step S16). In this case, the first substrate W1 is disposed such that the non-pattern surface thereof faces upwardly.

The first cleaning chamber 601 performs the first process on the non-patterned surface of the first substrate W1 (step S18). During the first process, the non-pattern surface of the first substrate W1 is cleaned by the brush unit 660. In addition, a chemical treatment, a rinsing treatment, or drying treatment may be performed on the non-pattern surface of the substrate W.

When the first process is completed, the first main transfer robot 520a takes out the substrate W from the first cleaning chamber 601 and transfers the substrate W to the empty first inversion unit 300a (step S20). In the first inversion unit 300a, the positions of the pattern surface and the non-pattern surface of the first substrate W1 are inversed (step S22).

The first substrate W1 is transferred to a cleaning chamber in which the substrate W can be taken in among the first cleaning chamber 601 and the second cleaning chamber 602 (step S24). For example, when others substrates W are taken into all the second cleaning chambers 602, or when the second main transfer robot 520b is transferring another substrate W, the first main transfer robot 520a takes out the first substrate W1 from the first inversion unit 300a and takes the first substrate W1 into the first cleaning chamber 601. Conversely, when others substrates W are taken into all the first cleaning chambers 601, or when the second main transfer robot 520b is transferring another substrate W, the first main transfer robot 520a takes the first substrate W1 out of the first inversion unit 300a and takes the first substrate W1 into the second cleaning chamber 602. If the first substrate W1 cannot be transferred to all first cleaning chambers 601 and all second cleaning chambers 602, the first substrate W1 is taken out from the first inversion unit 300a with one of the first main transfer robot 520a and the second main transfer robot 520b and transferred to the first sub buffer 402. Then, when the previous substrate W that has been treated is taken out from one of the first cleaning chamber 601 and the second cleaning chamber 602, the first substrate W1 is taken out from the first sub buffer 402 to the first main transfer robot 520a or the second main transfer robot 520b, and the first substrate W1 is taken into the first cleaning chamber 601 or the second cleaning chamber 602.

For example, when the first substrate W1 is taken into the second cleaning chamber 602 by the second main transfer robot 520b, the second cleaning chamber 602 performs the second process on the first substrate W1 (step S26). The first substrate W1 is disposed in the second cleaning chamber 602 such that the pattern surface thereof faces upwardly, and the substrate W is treated by supplying the treatment liquid to the pattern surface of the first substrate W1. For example, the chemical treatment, the rinsing treatment, the organic solvent treatment, and the drying treatment are all sequentially performed, or some of the selected treatments among them are performed.

Then, the second main transfer robot 520b takes out the first substrate W1 from the second cleaning chamber 602 and takes the first substrate W1 into the first main buffer 401 (step S28). In this case, the substrate W is maintained in a state where the pattern surface thereof faces upwardly. If there is no empty space in the main buffer 401, the second main transfer robot 520b takes in the first substrate W1 taken out of the second cleaning chamber 602 into the first sub buffer 402. Then, when an empty space is created in the first main buffer 401, the first substrate W1 is taken out from the first sub buffer 402 to the first main transfer robot 520a or the second main transfer robot 520b and then taken into the first main buffer 401.

Then, the index robot 120 takes out the first substrate W1 from the first main buffer 401 and carries the first substrate W1 into the container 80 placed in the load port 12 (S30).

As described above, after the first substrate W1 is transferred from the container 80 to the first main buffer 401, a second substrate W2, which is a subsequent substrate W, is transferred from the container 80 to the second main buffer 403 by the index robot 120. Similarly to the first substrate W1, the second substrate W2 is transferred in an order of the container 80, the second main buffer 403, the second inversion unit 300b, the third cleaning chamber 603 or the fourth cleaning chamber 604, the second inversion chamber 300b, the third cleaning chamber 603 or the fourth cleaning chamber 604, the second main buffer 403, and the container 80. The second substrate W2 may be taken and temporarily stored into the second sub buffer 404 in a transfer path.

In the above-described example, it has been described that the first substrate W1 is transferred from the container 80 to the first process block 22, and then the second substrate W2 is transferred from the container 80 to the second process block 24. However, after transferring the first substrate W1 from the container 80 to the first process block 22, another substrate W between the first substrate W1 and the second substrate W2 may be transferred to the first process block 22. For example, considering the number of substrates W that are being treated by the first process block 22 and the number of substrates W that are being treated by the second process block 24, the substrate W taken out of the container 80 is transferred to one of the first process block 22 and the second process block 24.

According to the exemplary embodiment of the present invention, the substrate W taken into the first main buffer 401 from the container 80 is not transferred to the second process block 24, but both the first process and the second process are performed on the substrate W in the first process block 22, which can further simplify a transfer path as compared to the case in which the first process and the second process are performed while transferring the same substrate W to the first process block 22 and the second process block 24.

According to the exemplary embodiment of this invention, since the first main transfer robot 520a and the second main transfer robot 520b each transfer the substrate W only to the cleaning chambers 601 and 602 provided at one side of the apparatus for treating a substrate, the substrate W may be simultaneously transferred to the first and second cleaning chambers 601 and 602 by the first main transfer robot 520a and the second transfer robot 520b.

According to the exemplary embodiment of the present invention, the first cleaning chamber 601 and the second cleaning chamber 602 are provided in the first process block 22 to have the same structure so as to perform both the first process and the second process, respectively. Accordingly, as compared to the structure in which the first cleaning chamber 601 cleans only the pattern surface of the substrate W and the second cleaning chamber 602 cleans only the non-pattern surface of the substrate W, the present structure provides more cleaning chambers that can be selected and used for performing the first process or second process. Therefore, even if it is difficult to take a new substrate W into one of the first cleaning chamber 601 or the second cleaning chamber 602, since there are a larger number of selectable cleaning chambers, the time for the substrate W to wait in the buffer unit 400 or the inversion unit 300 can be shortened.

According to the exemplary embodiment of the present invention, the first process, which is a treatment for the non-pattern surface of the substrate W, is first performed, and then the second process, which is a treatment for the pattern surface of the substrate W, is performed. In the process of performing the first process, foreign materials or particles may be attached to the pattern surface of the substrate W. In this case, by performing the second process after the first process, the foreign substances or particles attached to the pattern surface of the substrate W may be removed in the first process.

In the above-described example, it has been described as an example that two treatment blocks are provided. However, only one treatment block may be provided. Alternatively, three or more treatment blocks may be provided.

In the above-described example, the first cleaning chamber 601 and the second cleaning chamber 602 are provided in the same structure, and each of the first cleaning chamber 601 and the second cleaning chamber 602 is provided to have a structure capable of performing both the first process and the second process. However, in contrast, the first cleaning chamber 601 may be provided to perform only the first process among the first process and the second process, and the second cleaning chamber 602 may be provided to perform only the second process among the first process and the second process.

In the above-described example, it has been described that the buffer unit 400 includes the main buffer 401 and the sub buffer 402. However, in contrast, the buffer unit 400 may include only the main buffer 401.

In the above-described example, in the first process block 22, both the first process and the second process are performed on the substrate W taken into the first process block 22, and in the second process block 24, both the first process and the second process are performed on the substrate W taken into the second process block 24. However, in contrast, the substrate W may be transferred such that the first process is performed on the substrate W in one of the first process block 22 and the second process block 24, and the second process is performed on the substrate W in the other treatment block.

In the above-described example, it has been described that the first process is performed to clean the non-pattern surface of the substrate W using the brush, and the second process is performed to clean the pattern surface of the substrate W using the treatment liquid. However, the first process may be another type of process that treats the non-patterned surface of the substrate W in addition to brush cleaning. In addition, the second process may be another type of process for treating the pattern surface of the substrate W in addition to cleaning using the treatment liquid.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate, comprising:
an index module; and
a treatment block disposed adjacent to the index module,
wherein the index module includes:
one or more load ports on which the substrate is accommodated; and
an index frame provided with an index robot that transfers the substrate between a container placed in the one or more load ports and the treatment block, and
the treatment block includes:
a buffer unit in which the substrate temporarily stays;
an inversion unit configured to invert the substrate so that positions of a pattern surface and a non-pattern surface of the substrate are changed;
treating chambers configured to treat the substrate; and
transfer chambers each provided with a main transfer robot that transfers the substrate between the buffer unit, the inversion unit, and the treating chambers,
wherein the buffer unit and the inversion unit are disposed to be stacked in a vertical direction,
when viewed from a top view, the index frame and the buffer unit are arranged in a first direction,
the transfer chambers include:
a first transfer chamber disposed on one side of the buffer unit; and
a second transfer chamber disposed on another side of the buffer unit,
when viewed from the top view, the first transfer chamber, the buffer unit, and the second transfer chamber are arranged in a second direction perpendicular to the first direction,
the treating chambers include:
a first cleaning chamber arranged on one side of the first transfer chamber; and
a second cleaning chamber arranged on one side of the second transfer chamber,
when viewed from the top view, the first transfer chamber and the first cleaning chamber are arranged parallel to the first direction,
when viewed from the top view, the second transfer chamber and the second cleaning chamber are arranged parallel to the first direction,
the main transfer robot provided in the first transfer chamber is provided to directly transfer the substrate between the buffer unit, the inversion unit, and the first cleaning chamber, and
the main transfer robot provided in the second transfer chamber is provided to directly transfer the substrate between the buffer unit, the inversion unit, and the second cleaning chamber.

2. The apparatus for treating a substrate of claim 1, wherein the first cleaning chamber and the second cleaning chamber are arranged in a direction parallel to the second direction.

3. The apparatus for treating a substrate of claim 1, wherein the first cleaning chamber includes:
a support unit configured to support and rotate the substrate;
a brush unit configured to clean the substrate supported by the support unit; and
a liquid supply unit configured to supply a treatment liquid to the substrate supported by the support unit.

4. The apparatus for treating a substrate of claim 3, wherein the first cleaning chamber is provided as one of a plurality of first cleaning chambers, and
the plurality of first cleaning chambers are disposed to be stacked on each other.

5. The apparatus for treating a substrate of claim 4, wherein the first cleaning chamber and the second cleaning chamber are provided in the same structure.

6. The apparatus for treating a substrate of claim 4, further comprising: a controller configured to control the treatment block,
wherein the controller is configured to,
control the treating chambers such that the pattern surface of the substrate is cleaned by supplying the treatment liquid to the pattern surface of the substrate with the liquid supply unit when the substrate is placed on the support unit with the pattern surface of the substrate facing upwardly, and
control the treating chambers such that the non-pattern surface of the substrate is cleaned with the brush unit when the substrate is placed on the support unit with the non-pattern surface of the substrate facing upwardly.

7. The apparatus for treating a substrate of claim 1, wherein the buffer unit includes:
a main buffer; and
a sub buffer disposed to be stacked with the main buffer,
wherein the main transfer robot is capable of transferring the substrate to the main buffer and the sub buffer, respectively.

8. The apparatus for treating a substrate of claim 7, wherein the sub buffer is disposed between the main buffer and the inversion unit.

9. The apparatus for treating a substrate of claim 1, wherein a plurality of inversion units are provided,
the inversion units are stacked on each other, and
the plurality of inversion units are disposed adjacent to each other.

10. The apparatus for treating a substrate of claim 1, wherein the main transfer robot includes:
a base plate; and
a hand mounted on the base plate,
wherein the hand is provided to be movable forward and backward with respect to the base plate, and
the base plate is capable of a movement in a third direction and a rotational movement among a movement parallel to the first direction, a movement parallel to the second direction, a movement in the third direction perpendicular to the first direction and the second direction, respectively, and the rotational movement around the third direction as an axis.

11. The apparatus for treating a substrate of claim 10, wherein a plurality of hands are provided to the main transfer robot; and
the plurality of hands are provided to be movable forward and backward independently of each other.

12. An apparatus for treating a substrate, comprising:
an index block; and
a first process block and a second process block disposed adjacent to the index block,
wherein the index block includes:
    one or more load ports on which the substrate is accommodated;
    an index frame provided with an index robot that transfers the substrate between a container placed in the one or more load ports and the first process block, and between the container placed in the one or more load ports and the second process block, and
the first process block and the second process block are stacked in a vertical direction,
wherein each of the first process block and the second process block includes:
    a buffer unit in which the substrate temporarily stays;
    an inversion unit configured to invert the substrate so that positions of a pattern surface and a non-pattern surface of the substrate are changed;
    treating chambers configured to treat the substrate; and
    transfer chambers provided with a main transfer robot that transfers the substrate between the buffer unit, the inversion unit, and the treating chambers,
wherein the buffer unit and the inversion unit are disposed to be stacked in the vertical direction,
when viewed from a top view, the index frame and the buffer unit are arranged in a first direction,
the transfer chambers include:
    a first transfer chamber disposed on one side of the buffer unit; and
    a second transfer chamber disposed on another side of the buffer unit,
when viewed from the top view, the first transfer chamber, the buffer unit, and the second transfer chamber are arranged in a second direction perpendicular to the first direction,
the treating chambers include:
    a first cleaning chamber arranged on one side of the first transfer chamber; and
    a second cleaning chamber arranged on one side of the second transfer chamber,
when viewed from the top view, the first transfer chamber and the first cleaning chamber are arranged parallel to the first direction,
when viewed from the top view, the second transfer chamber and the second cleaning chamber are arranged parallel to the first direction,
the first cleaning chamber and the second cleaning chamber are arranged parallel to the second direction,
the main transfer robot provided in the first transfer chamber is provided to directly transfer the substrate between the buffer unit, the inversion unit, and the first cleaning chamber, and
the main transfer robot provided in the second transfer chamber is provided to directly transfer the substrate between the buffer unit, the inversion unit, and the second cleaning chamber.

13. The apparatus for treating a substrate of claim 12, wherein the first cleaning chamber and the second cleaning chamber provided in the first process block, and the first cleaning chamber and the second cleaning chamber provided in the second process block each include:
    a support unit configured to support and rotate the substrate;
    a brush unit configured to clean the substrate supported by the support unit; and
    a liquid supply unit configured to supply a treatment liquid to the substrate supported by the support unit.
14. The apparatus for treating a substrate of claim 13, further comprising a controller configured to controlling the first process block and the second process block,
    wherein the controller is configured to,
        control the treating chambers such that the pattern surface of the substrate is cleaned by supplying a treatment liquid to the pattern surface of the substrate with the liquid supply unit when the substrate is placed on the support unit with the pattern surface of the substrate facing upwardly, and
        control the treating chambers such that the non-pattern surface of the substrate is cleaned with the brush unit when the substrate is placed on the support unit with the non-pattern surface of the substrate facing upwardly.
15. The apparatus for treating a substrate of claim 12, wherein the buffer unit includes:
    a main buffer; and
    a sub buffer disposed to be stacked with the main buffer,
    wherein the main transfer robot is provided to transfer the substrate to the main buffer and the sub buffer, respectively,
    the first process block is disposed on the second process block,
    in the first process block, the main buffer is disposed below the inversion unit, and the sub buffer is disposed between the main buffer and the inversion unit, and
    in the second process block, the main buffer is disposed above the inversion unit, and the sub buffer is disposed between the main buffer and the inversion unit.
16. The apparatus for treating a substrate of claim 12, wherein the main transfer robot includes:
    a base plate; and
    a plurality of hands mounted on the base plate,
    wherein the plurality of hands are provided to be movable forward and backward independently of each other, and
    the base plate is capable of a movement in a third direction and a rotational movement among a movement parallel to the first direction, a movement parallel to the second direction, a movement in the third direction perpendicular to the first direction and the second direction, respectively, and the rotational movement around the third direction.

\* \* \* \* \*